(12) United States Patent
Lim et al.

(10) Patent No.: US 11,437,406 B2
(45) Date of Patent: Sep. 6, 2022

(54) SEMICONDUCTOR DEVICE HAVING A CAPACITIVE STRUCTURE AND METHOD OF FORMING THE SAME

(71) Applicant: GLOBALFOUNDRIES Singapore Pte. Ltd., Singapore (SG)

(72) Inventors: Phyllis Shi Ya Lim, Singapore (SG); Handoko Linewih, Singapore (SG); Shu Zhong, Singapore (SG); Chor Shu Cheng, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 228 days.

(21) Appl. No.: 16/721,955

(22) Filed: Dec. 20, 2019

(65) Prior Publication Data
US 2021/0193692 A1 Jun. 24, 2021

(51) Int. Cl.
*H01L 29/94* (2006.01)
*H01L 27/12* (2006.01)
*H01L 29/40* (2006.01)
*H01L 29/78* (2006.01)
(Continued)

(52) U.S. Cl.
CPC ...... *H01L 27/1207* (2013.01); *H01L 27/0629* (2013.01); *H01L 27/0805* (2013.01); *H01L 27/1203* (2013.01); *H01L 29/401* (2013.01); *H01L 29/7841* (2013.01)

(58) Field of Classification Search
None
See application file for complete search history.

(56) References Cited

U.S. PATENT DOCUMENTS

| 5,759,907 A | 6/1998 | Assaderaghi et al. |
| 6,627,954 B1 | 9/2003 | Seefeldt |
| 6,664,580 B2 | 12/2003 | Jao |

(Continued)

FOREIGN PATENT DOCUMENTS

| CN | 105914138 A | 8/2016 |
| EP | 0450796 A2 | 10/1991 |

OTHER PUBLICATIONS

PCT/US2017/046009 is attached for the filling date (Year: 2017).*
(Continued)

*Primary Examiner* — Bilkis Jahan
(74) *Attorney, Agent, or Firm* — Viering Jentschura & Partner mbB

(57) ABSTRACT

A semiconductor device may be provided, including a substrate which includes a first semiconductor layer having a well region arranged within the first semiconductor layer, a buried insulator layer arranged over the first semiconductor layer, and a second semiconductor layer arranged over the buried insulator layer. The semiconductor device may include a capacitive structure including: the well region, at least one contact to the well region, at least a portion of the buried insulator layer over the well region, at least a portion of the second semiconductor layer, a source region and a drain region arranged over the second semiconductor layer, a gate dielectric layer arranged over the second semiconductor layer and arranged laterally between the source region and the drain region, and a gate layer arranged over the gate dielectric layer. The well region, the source region, and the drain region may have the same conductivity type.

20 Claims, 16 Drawing Sheets

(51) Int. Cl.
H01L 27/06 (2006.01)
H01L 27/08 (2006.01)

(56) References Cited

U.S. PATENT DOCUMENTS

| | | | |
|---|---|---|---|
| 7,064,369 B2 | 6/2006 | Koh | |
| 7,768,044 B2 | 8/2010 | He et al. | |
| 9,541,521 B1* | 1/2017 | Hoque | G01N 27/4148 |
| 9,735,174 B2 | 8/2017 | Hoentschel et al. | |
| 2005/0124133 A1 | 6/2005 | Tu | |
| 2006/0244061 A1* | 11/2006 | Nowak | H01L 29/94 |
| | | | 257/E29.345 |
| 2007/0235788 A1 | 10/2007 | Kao | |
| 2010/0163947 A1 | 7/2010 | Lee | |
| 2010/0264492 A1* | 10/2010 | Surdeanu | H01L 29/78648 |
| | | | 438/157 |
| 2012/0292700 A1* | 11/2012 | Khakifirooz | H01L 29/42384 |
| | | | 438/164 |
| 2017/0229536 A1* | 8/2017 | Stuber | H01L 29/36 |
| 2018/0372679 A1* | 12/2018 | Ayele | G01N 27/4148 |
| 2020/0144369 A1* | 5/2020 | Lin | H01L 27/1203 |

OTHER PUBLICATIONS

Guissi, "Everything You Need to Know about FDSOI Technology—Advantages, Disadvantages, and Applications of FDSOI", https://www.coventor.com/blog/everything-you-need-to-know-about-fdsoi-technology-advantages-disadvantages-and-applications-of-fdsoi/, Jul. 20, 2018, 2 pages, Coventor, Inc.

* cited by examiner

700

702 provide a substrate including a first semiconductor layer, a second semiconductor layer, and a buried insulator layer arranged between the first semiconductor layer and the second semiconductor layer

704 form a well region within the first semiconductor layer

706 form at least one contact to the well region

708 form a source region and a drain region over the second semiconductor layer

710 form a gate dielectric layer over the second semiconductor layer and laterally between the source region and the drain region

712 form a gate layer arranged over the gate dielectric layer, thereby forming a capacitive structure at least partially within the substrate, wherein the well region, the source region and the drain region have the same conductivity type

FIG. 7

SEMICONDUCTOR DEVICE HAVING A CAPACITIVE STRUCTURE AND METHOD OF FORMING THE SAME

TECHNICAL FIELD

The present disclosure relates generally to a semiconductor device and a method of forming a semiconductor device. In particular, the present disclosure relates to a capacitor device and a method of forming a capacitor device.

BACKGROUND

Capacitors are widely used in complementary-metal-oxide-semiconductor (CMOS) integrated circuits. A typical type of capacitor is a Metal-Oxide-Semiconductor (MOS) capacitor, where the near-surface region of a doped semiconductor substrate acts as one terminal of the capacitor, and a gate layer acts as the other terminal. A gate oxide arranged between the gate layer and the semiconductor substrate acts as the capacitor dielectric.

MOS capacitors are commonly used in many circuit applications, such as charge pump, and RC-delay/trigger circuitry. However, the silicon substrate estate taken by the MOS capacitors may be significant, and accordingly MOS capacitors may consume a large part of the total area of an integrated circuit. Hence, decreasing the size of the capacitor devices or increasing the capacitance density of the capacitor devices may be desired to produce an integrated circuit in a smaller size.

SUMMARY

According to various non-limiting embodiments, there may be provided a semiconductor device. The semiconductor device may include a substrate including: a first semiconductor layer having a well region arranged within the first semiconductor layer, a buried insulator layer arranged over the first semiconductor layer, and a second semiconductor layer arranged over the buried insulator layer. The semiconductor device may further include a capacitive structure, wherein the capacitive structure may include the well region, at least one contact to the well region, at least a portion of the buried insulator layer over the well region, at least a portion of the second semiconductor layer, a source region and a drain region arranged over the second semiconductor layer, a gate dielectric layer arranged over the second semiconductor layer and arranged laterally between the source region and the drain region, and a gate layer arranged over the gate dielectric layer. The well region, the source region, and the drain region may have the same conductivity type.

According to various non-limiting embodiments, there may be provided a method of forming a semiconductor device. The method may include providing a substrate, wherein the substrate includes a first semiconductor layer, a second semiconductor layer, and a buried insulator layer arranged between the first semiconductor layer and the second semiconductor layer. The method may further include forming a well region within the first semiconductor layer; forming at least one contact to the well region; forming a source region and a drain region over the second semiconductor layer; forming a gate dielectric layer over the second semiconductor layer and laterally between the source region and the drain region; and forming a gate layer arranged over the gate dielectric layer, thereby forming a capacitive structure at least partially within the substrate. The well region, the source region and the drain region may have the same conductivity type.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which:

FIG. 7 shows a flowchart illustrating a method of forming a semiconductor device according to various non-limiting embodiments.

DETAILED DESCRIPTION

Figure 1:
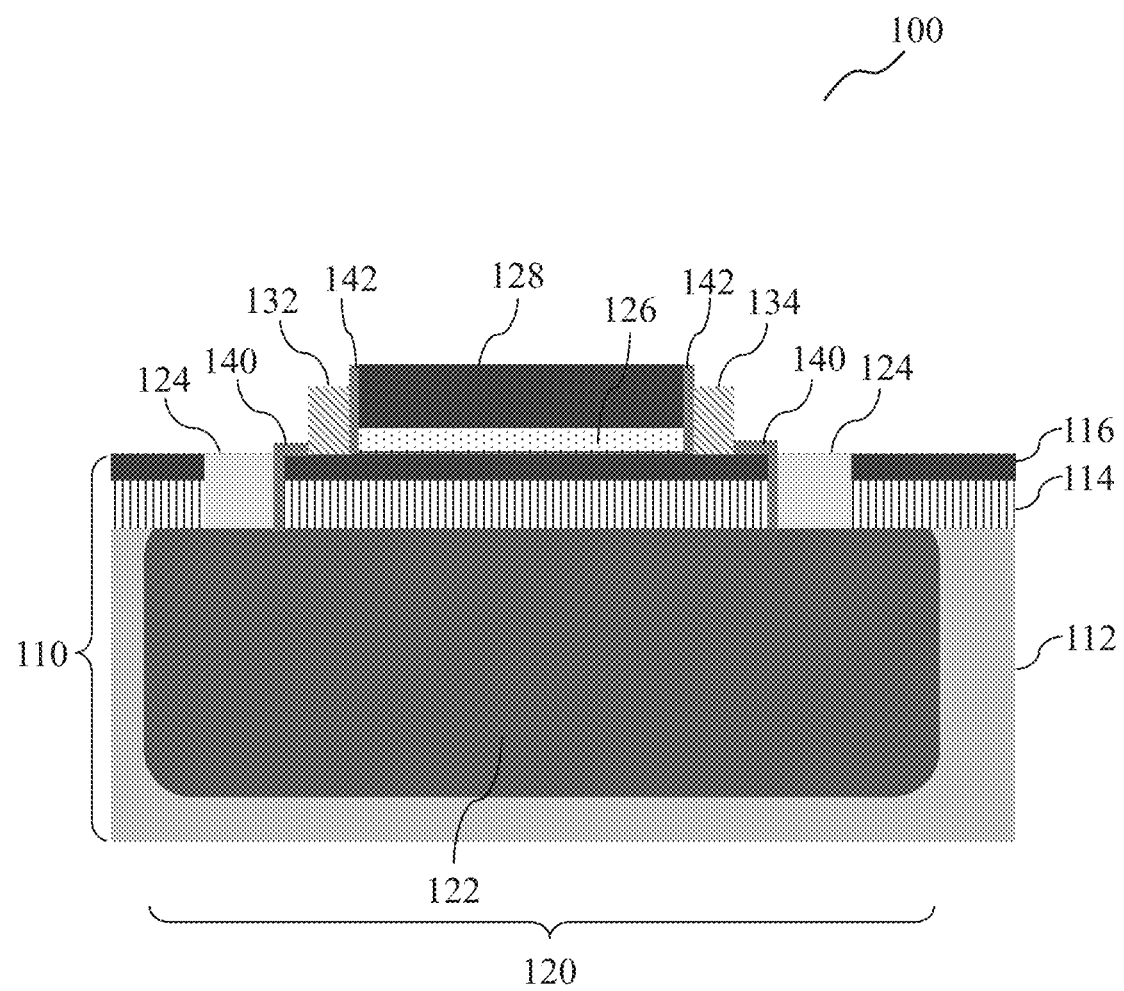
FIG. 1 shows a schematic diagram illustrating a cross-sectional view of a semiconductor device according to various non-limiting embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

The term "connected" (or "coupled") herein, when used to refer to two physical elements, means a direct connection between the two physical elements or a connection through one or more intermediary elements.

It should be understood that the terms "on", "over", "under", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The non-limiting embodiments described below in context of the devices are analogously valid for the respective methods, and vice versa. Furthermore, it will be understood that the embodiments described below may be combined; for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

Various non-limiting embodiments relate to a semiconductor device, for example, a capacitor device, such as a MOS (metal-oxide-semiconductor) capacitor (MOSCAP) device.

FIG. 1 shows a schematic diagram illustrating a cross-sectional view of a semiconductor device 100 according to various non-limiting embodiments.

As shown in FIG. 1, the semiconductor device 100 may include a substrate 110. The substrate 110 may include a first semiconductor layer 112, a buried insulator layer 114 arranged over the first semiconductor layer 112, and a second semiconductor layer 116 arranged over the buried insulator layer 114. The first semiconductor layer 112 may include a well region 122 arranged within the first semiconductor layer 112. The semiconductor device 100 may further include a capacitive structure 120, wherein the capacitive structure 120 may include the well region 122, at least one contact 124 to the well region 122, at least a portion of the buried insulator layer 114 over the well region 122, at least a portion of the second semiconductor layer 116, a source region 132 and a drain region 134 arranged over the second semiconductor layer 116, a gate dielectric layer 126 arranged over the second semiconductor layer 116 and arranged laterally between the source region 132 and the drain region 134, and a gate layer 128 arranged over the gate dielectric layer 126. The well region 122, the source region 132, and the drain region 134 may have the same conductivity type, for example, one of N-type or P-type.

According to various non-limiting embodiments, the well region 122 may be electrically coupled to the gate layer 128 through the at least one contact 124 to the well region 122. The source region 132 may be electrically coupled to the drain region 134.

Figure 11:
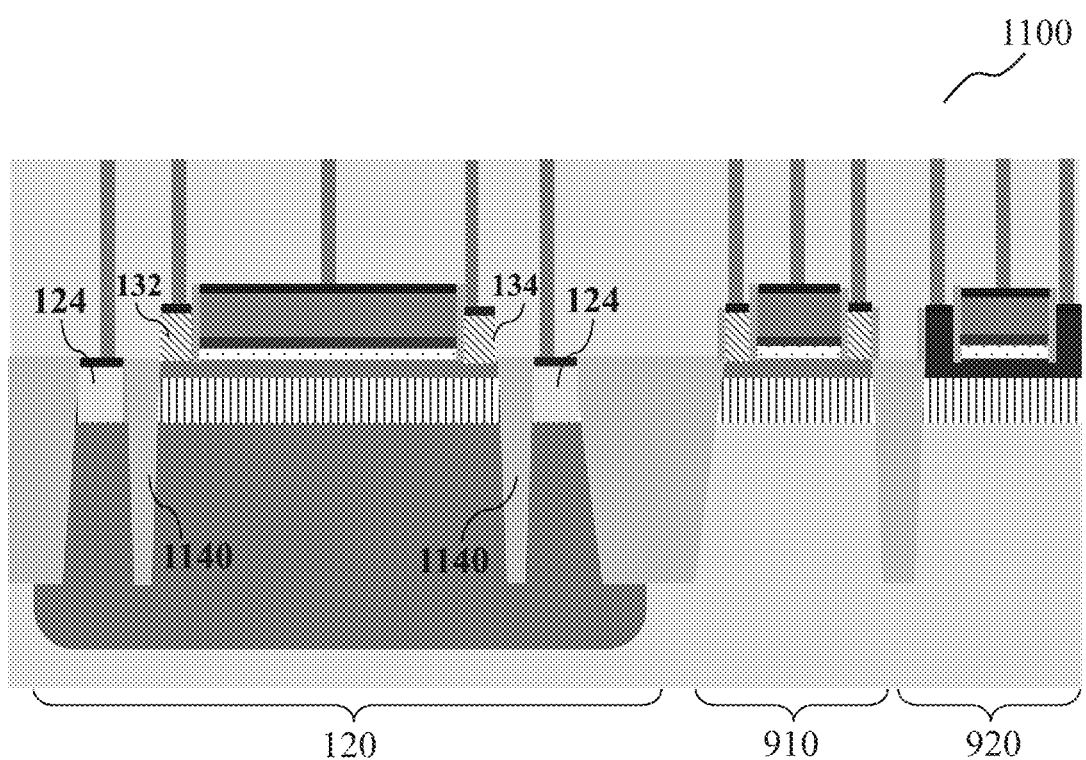
FIG. 11 shows a cross-sectional view of a semiconductor device according to various non-limiting embodiments.

According to various non-limiting embodiments, the semiconductor device 100 may include an isolation element 140 configured to isolate the at least one contact 124 from the source region 132 and the drain region 134. The isolation element 140 may include a shallow trench isolation (STI) or a dielectric spacer. In various non-limiting embodiments shown in FIG. 1, the isolation element 140 may include a dielectric spacer, which may include a dielectric material, such as silicon nitride. In various non-limiting embodiments as shown in FIG. 11 below, the isolation element 140 may include a STI.

The semiconductor device 100 may include a further isolation element 142 configured to isolate the gate layer 128 from the source region 132 and the drain region 134. The further isolation element 142 may include a dielectric spacer, such as a silicon nitride spacer, or may include a STI arranged between the gate layer 128 and the source/drain region.

According to various non-limiting embodiments, the capacitive structure 120 may include a first capacitor formed by at least the well region 122, the buried insulator layer 114 (e.g. at least a portion of the buried insulator layer 114 arranged over the well region 122), and the second semiconductor layer 116 (e.g., at least a portion of the second semiconductor layer 116 arranged over the well region 122). The buried insulator layer 114 may be in direct contact with the well region 122.

The capacitive structure 120 may further include a second capacitor formed by at least the second semiconductor layer 116 (e.g. the portion of the second semiconductor layer 116 arranged over the well region 122), the gate dielectric layer 126, and the gate layer 128.

According to various non-limiting embodiments, a dual gate field effect transistor may be formed by at least the first capacitor, the second capacitor, the source region 132, and the drain region 134.

In various non-limiting embodiments, the well region 122 and the gate layer 128 may be electrically coupled to a first terminal, and the source region 132 and the drain region 134 may be electrically coupled to a second terminal. In other words, the well region 122 and the gate layer 128 may be electrically connected to each other, and the source region 132 and the drain region 134 may be electrically connected to each other. In this connection, the first capacitor may be connected to the second capacitor in parallel. The dual gate field effect transistor may be configured to provide a capacitance between the first terminal and the second terminal, e.g. the sum of the capacitances of the first capacitor and the second capacitor.

A primary gate may include at least the gate layer 128 configured to generate a channel between the source region 132 and the drain region 134 of the dual gate field effect transistor; and a secondary gate may include at least the well region 122 configured to generate a channel between the source region 132 and the drain region 134 of the dual gate field effect transistor.

According to various non-limiting embodiments, a thickness of the buried insulator layer 114 may be larger than a thickness of the gate dielectric layer 126. The buried insulator layer 114 may be a thin insulator layer having a thickness in a range from about 10 nm to about 30 nm. In a non-limiting example, the buried insulator layer 114 may have a thickness of about 20 nm. The gate dielectric layer 126 may have a thickness in a range from about 2 nm to about 4 nm. In various non-limiting embodiments, the gate dielectric layer 126 may include a high-k dielectric material, such as hafnium dioxide ($HfO_2$), zirconium dioxide ($ZrO_2$), titanium dioxide ($TiO_2$) or combinations thereof, which has "k" values higher than 3.9.

The second semiconductor layer 116 may be a thin active layer arranged on the buried insulator layer 114. In various non-limiting embodiments, the second semiconductor layer 116 may have a thickness of about 12 nm or less, e.g. in a range from about 6 nm to about 12 nm.

According to various non-limiting embodiments, the semiconductor device 100 may further include a salicide layer (not shown in FIG. 1) arranged over the gate layer 128, the contact 124, the source region 132, and the drain region 134. The salicide layer provided on the gate layer 128 may help to reduce a high parasitic resistance incurred by un-salicided gate layer 128, which in return reduces an equivalent series resistance (ESR) in the capacitive structure. In various non-limiting embodiments, the salicide layer may include nickel-silicon (NiSi) salicide.

According to various non-limiting embodiments, the semiconductor device 100 may further include a metal gate layer (not shown in FIG. 1) arranged between the gate layer 128 and the gate dielectric layer 126. The gate layer 128 may include polycrystalline silicon, and may have a thickness of about 30 nm. In various non-limiting embodiments, the metal gate layer may include titanium nitride (TiN), and may have a thickness of about 0.5 nm to about 1.5 nm. In various non-limiting embodiments, the metal gate layer may include aluminum (Al), and may have a thickness of about 0.2 nm.

For more advanced technology 28 nm and below, the high-k insulator with metal gate (HKMG) technology may be used to form the gate dielectric layer 126 and the metal gate layer, which may increase the gate capacitance, reduce leakage and increase the performance of the MOS capacitive structure formed therefrom. In addition, the MOS capacitive structure may be formed in a part of MOSFET construction process, without requirement of additional process, mask and cost.

According to various non-limiting embodiments, the second semiconductor layer 116 may be un-doped, or may have the same conductivity type with the well region 122, the source region 132, and the drain region 134. In various non-limiting embodiments, the second semiconductor layer 116 may be a thin silicon film of a fully-depleted silicon-on-insulator (FD-SOI) substrate 110 used to form a channel, which eliminates the need to have the channel doped, making it fully depleted, i.e. a normally off device. The control of channel conduction may be carried out by the gate control, allowing an ultra-low threshold voltage. In various non-limiting embodiments, the second semiconductor layer 116 may be doped to have the same conductivity type as the well region 122, the source region 132, and the drain region 134. In a non-limiting embodiment, the second semiconductor layer 116 may be doped with N-type dopants to form a NMOS capacitor structure with a N-type channel, which may be referred to as a MOS varactor.

In various non-limiting embodiments, the second semiconductor layer 116 may be doped with N-type dopants, such as phosphorous. The well region 122, the source region 132, and the drain region 134 may also be doped with N-type dopants.

According to various non-limiting embodiments, the well region 122 may have a doping concentration in a range from about $5e15\ cm^{-3}$ to about $5e16\ cm^{-3}$. The source region 132 and the drain region 134 may have a doping concentration in a range from about $1e19\ cm^{-3}$ to about $1e20\ cm^{-3}$. The at least one contact 124 to the well region 122 may also be doped with N-type dopants with a doping concentration in a range from about $1e19\ cm^{-3}$ to about $1e20\ cm^{-3}$. Accordingly, the capacitive structure 120 may be a N-type capacitor (NCAP) structure. It is understood that the conductivity type of the well region 122, the source/drain region 132, 134 and the contact 124 may also be P-type to form a P-type capacitor (PCAP) structure in other non-limiting embodiments, where the second semiconductor layer 116 may be un-doped or may be doped with P-type dopants to form the P-type capacitor structure with a P-type channel.

The first semiconductor layer 112 may be doped with a conductivity type different from the conductivity type of the well region, the source region and the drain region. The first semiconductor layer 112 may have a doping concentration of about $1e15\ cm^{-3}$. In a non-limiting embodiment, the first semiconductor layer 112 may be a P-substrate layer doped with boron at the doping concentration of about $1e15\ cm^{-3}$.

According to various non-limiting embodiments, the first semiconductor layer 112 of the substrate 110 may include silicon (Si), germanium (Ge), silicon-germanium (SiGe), or combinations thereof.

The buried insulator layer 114 of the substrate 110 may include an insulating material, such as silicon oxide ($SiO_2$), silicon nitride (SiN), or combinations thereof.

According to various non-limiting embodiments, the second semiconductor layer 116 of the substrate 110 may include silicon, germanium, silicon-germanium, indium gallium arsenide (InGaAs), or combinations thereof.

The second semiconductor layer 116 of the substrate 110 may include a single-crystalline semiconductor material.

According to various non-limiting embodiments, the substrate 110 may be a semiconductor-on-insulator substrate. The semiconductor-on-insulator substrate 110 may be provided or formed such that the second semiconductor layer 116 of the substrate 110 may be a single-crystalline semiconductor layer. Examples of the semiconductor-on-insulator substrate 110 may include but are not limited to a silicon-on-insulator (SOI) substrate, a germanium-on-insulator (GeOI) substrate, a SiGe-on-insulator (SiGe-OI) substrate, a InGaAs-on-insulator (InGaAs-OI) substrate, or combinations thereof.

In various non-limiting embodiments, the substrate 110 may include a silicon-on-insulator (SOI) substrate, wherein the second semiconductor layer 116 may include single-crystalline silicon.

The substrate 110 may include a fully depleted silicon-on-insulator (FD-SOI) substrate, or a partially depleted silicon-on-insulator substrate (PD-SOI) substrate. In various non-limiting embodiments where the capacitive structure may be formed along with MOSFET structures on the FD-SOI substrate, the FD-SOI substrate may utilize back gate to control the threshold voltage, i.e. turning on of the active MOSFET device, and accordingly require a thin buried insulator layer (e.g. with a thickness of about 10-30 nm).

According to various non-limiting embodiments, the substrate 110 may include a SOI substrate whose surface is a face (100). For the MOS capacitor structure, there is no restriction or requirement on a crystal plane orientation of the substrate 110, so that an impurity concentration, film thickness, dimension ratio of the device and the like may be appropriately adjusted to obtain a capacitance characteristic that is suitable according to the plane orientation set by other requirements. In various non-limiting embodiments of a PMOS semiconductor device (e.g. where the semiconductor device 100 further includes a PMOS transistor), a surface of the PMOS semiconductor device may use a face (110), or a hybrid plane orientation substrate whose surface is mixed by a face (100) and a face (110) may be used, in order to improve performance of the PMOS semiconductor device.

Figure 6:
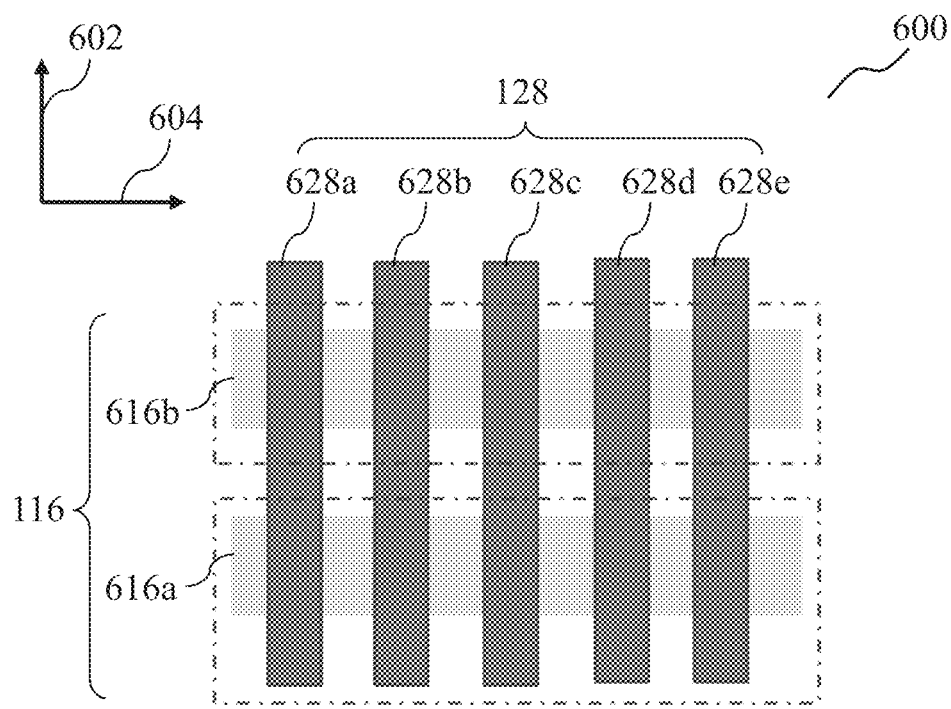
FIG. 6 shows a top view of a semiconductor device according to various non-limiting embodiments.

According to various non-limiting embodiments, the second semiconductor layer 116 may include a plurality of blocks arranged parallel to each other along a first direction, and the gate layer may include a plurality of strips arranged parallel to each other along a second direction perpendicular to the first direction, as illustrated in FIG. 6 below. Accordingly, the capacitive structure 120 may be an area type capacitive structure, or a peripheral (finger) type capacitive structure.

According to various non-limiting embodiments, the semiconductor device 100 includes a capacitive structure including the first capacitor and the second capacitor, which provide a higher density MOS capacitance and at the same time reduce the substrate area occupied by conventional lower density capacitive structure. The higher density capacitive structure may be used in many applications, for example, in a voltage doubler charge pump circuitry or a RC-delay/trigger circuitry.

Figure 2:
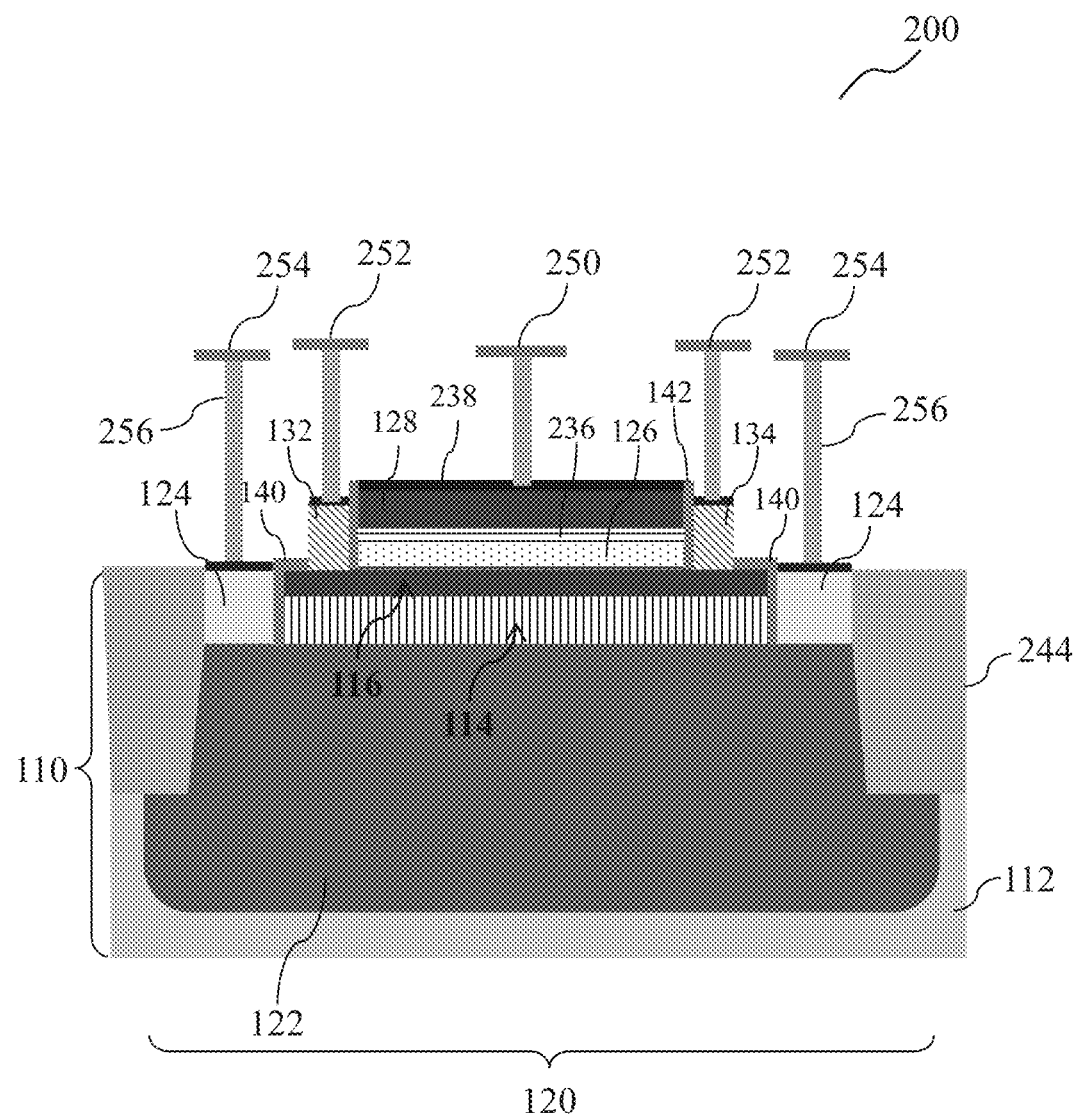
FIG. 2 shows a cross-sectional view of a semiconductor device according to various non-limiting embodiments.
Figure 3:
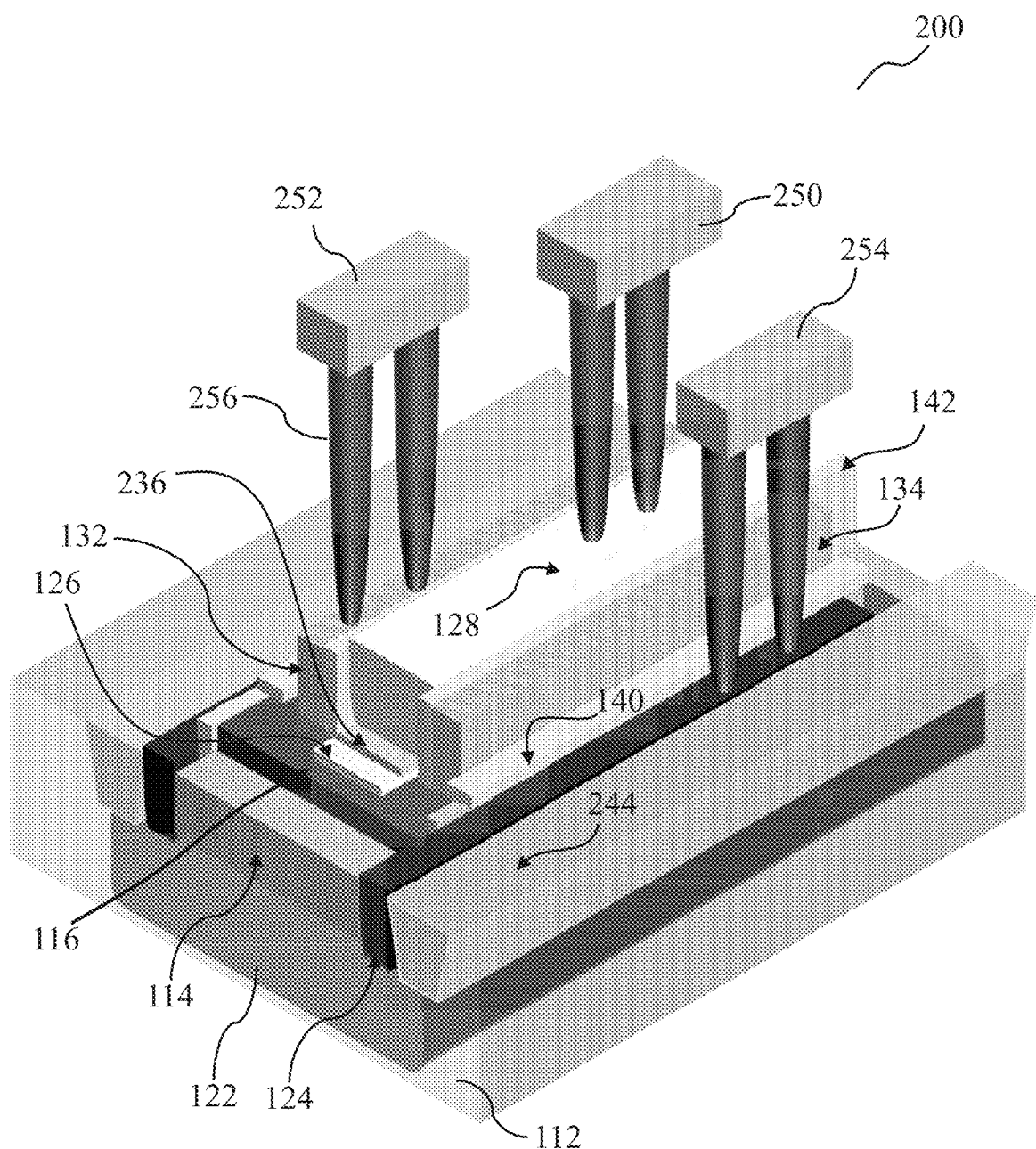
FIG. 3 shows a perspective view of the semiconductor device of FIG. 2 according to various non-limiting embodiments.
Figure 4:
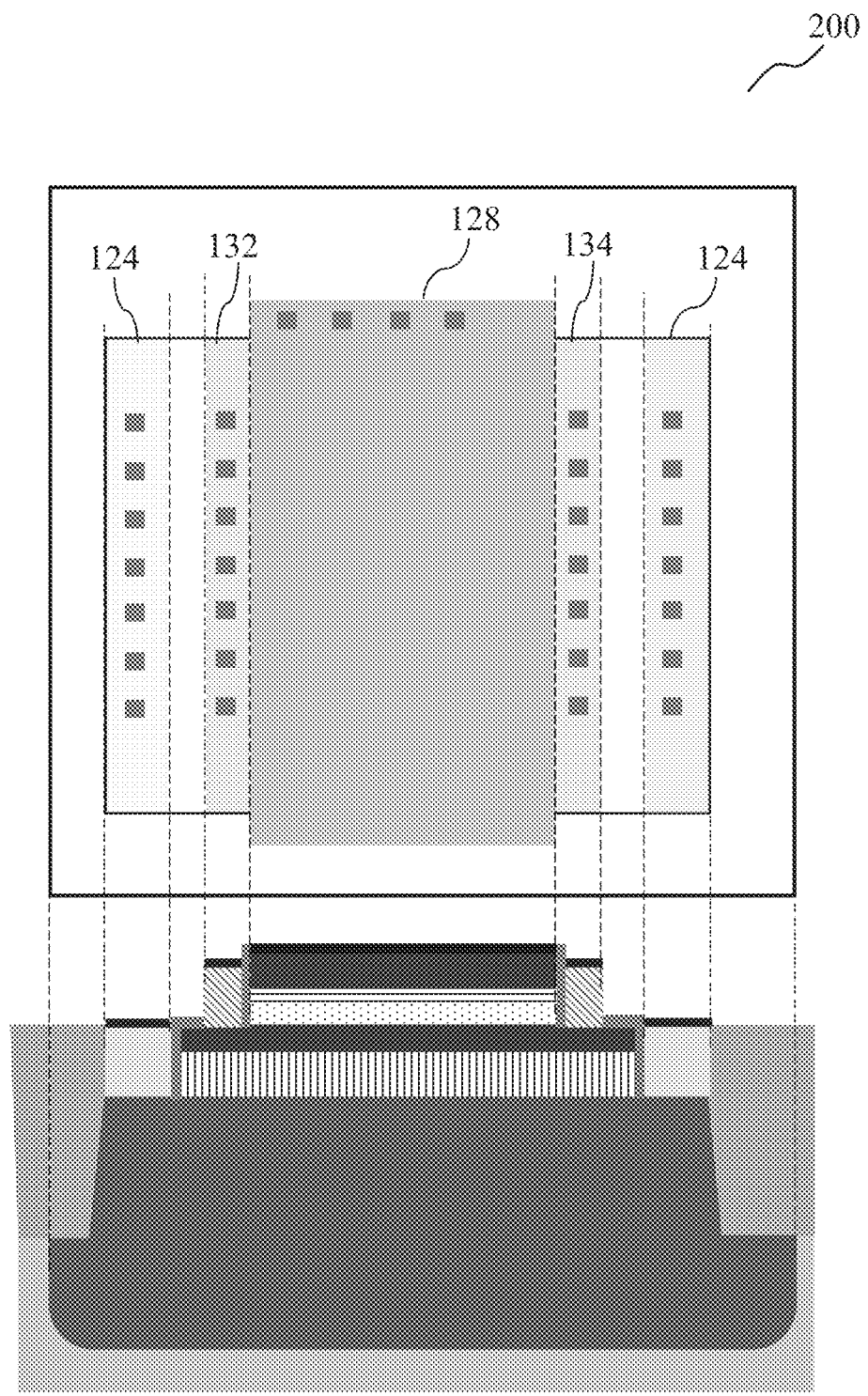
FIG. 4 shows a top view of the semiconductor device of FIG. 2 according to various non-limiting embodiments.

FIG. 2 shows a cross-sectional view of a semiconductor device 200 according to various non-limiting embodiments. FIG. 3 shows a perspective view of the semiconductor device 200 of FIG. 2 according to various non-limiting embodiments, and FIG. 4 shows a top view of the semiconductor device 200 of FIG. 2 according to various non-limiting embodiments. The semiconductor device 200 is similar to the semiconductor device 100 of FIG. 1, and thus the common features are labeled with the same reference numerals. Various embodiments described with reference to FIG. 1 are analogously valid for the semiconductor device 200 of FIGS. 2-4, and vice versa.

Similar to the semiconductor device 100, the semiconductor device 200 may include the substrate 110 having the first semiconductor layer 112, the buried insulator layer 114 arranged over the first semiconductor layer 112, and the second semiconductor layer 116 arranged over the buried insulator layer 114. The first semiconductor layer 112 may include the well region 122 arranged within the first semiconductor layer 112. The semiconductor device 100 may further include the capacitive structure 120, wherein the capacitive structure 120 may include the well region 122, the at least one contact 124 to the well region 122, at least a portion of the buried insulator layer 114 over the well region 122, at least a portion of the second semiconductor layer 116, the source region 132 and the drain region 134 arranged over the second semiconductor layer 116, the gate dielectric layer 126 arranged over the second semiconductor layer 116 and arranged laterally between the source region 132 and the drain region 134, and the gate layer 128 arranged over the gate dielectric layer 126. The well region 122, the source region 132, and the drain region 134 may have the same conductivity type, for example, one of N-type or P-type.

As described in various non-limiting embodiments above, the substrate 110 may be a semiconductor-on-insulator substrate, which may be provided or formed such that the second semiconductor layer 116 of the substrate 110 may be a single-crystalline semiconductor layer. Examples of the semiconductor-on-insulator substrate 110 may include but are not limited to a silicon-on-insulator (SOI) substrate, a germanium-on-insulator (GeOI) substrate, a SiGe-on-insulator (SiGe-OI) substrate, a InGaAs-on-insulator (InGaAs-OI) substrate, or combinations thereof. In a non-limiting example, the substrate 110 may be a silicon-on-insulator substrate, wherein the second semiconductor layer 114 may include single-crystalline silicon.

According to various non-limiting embodiments, the semiconductor device 200 may further include a metal gate layer 236 arranged between the gate layer 128 and the gate dielectric layer 126. In various non-limiting embodiments, the metal gate layer 236 may include titanium nitride, and may have a thickness of about 0.5 nm to about 1.5 nm. In various non-limiting embodiments, the metal gate layer may include aluminum, and may have a thickness of about 0.2 nm.

The high-k insulator with metal gate (HKMG) technology may be used to form the gate dielectric layer 126 and the metal gate layer 236 for technology of 28 nm and below, which may increase the gate capacitance, reduce leakage and increase the performance of the MOS capacitor structure formed therefrom. In addition, the MOS capacitor structure may be formed in a part of MOSFET construction process utilizing the high-k insulator with metal gate process, without requirement of additional process, mask and cost.

According to various non-limiting embodiments, the semiconductor 200 may further include a salicide layer 238 arranged over the gate layer 128. The salicide layer 238 provided on the gate layer 128 may help to reduce a high parasitic resistance incurred by un-salicided gate layer 128, which in return reduces an equivalent series resistance (ESR) in the capacitive structure. The salicide layer 238 may include nickel-silicon (NiSi) salicide. The salicide layer 238 may also be arranged over the contact 124, the source region 132 and the drain region 134 to provide the above-mentioned advantages, as shown in FIG. 2.

According to various non-limiting embodiments, the contact 124 may be arranged on a top surface of the well region 122, or may be at least partially arranged in the well region 122 as shown in the non-limiting embodiments of FIG. 10 below.

The well region 122 may be electrically coupled to the gate layer 128 through the contact 124 to the well region 122. The source region 132 may be electrically coupled to the drain region 134.

According to various non-limiting embodiments, the semiconductor device 200 may include the isolation element 140 configured to isolate the contact 124 from the source region 132 and the drain region 134. The isolation element 140 may include a shallow trench isolation (STI) or a dielectric spacer. In various non-limiting embodiments shown in FIGS. 2-4, the isolation element 140 may include a dielectric spacer, which may include a dielectric material, such as silicon nitride. In various non-limiting embodiments as shown in FIG. 11 below, the isolation element 140 may include a STI.

The semiconductor device 200 may include the further isolation element 142 configured to isolate the gate layer 128 from the source region 132 and the drain region 134. The further isolation element 142 may include a dielectric spacer, such as a silicon nitride spacer, or may include a STI arranged between the gate layer 128 and the source/drain region.

Figure 10:
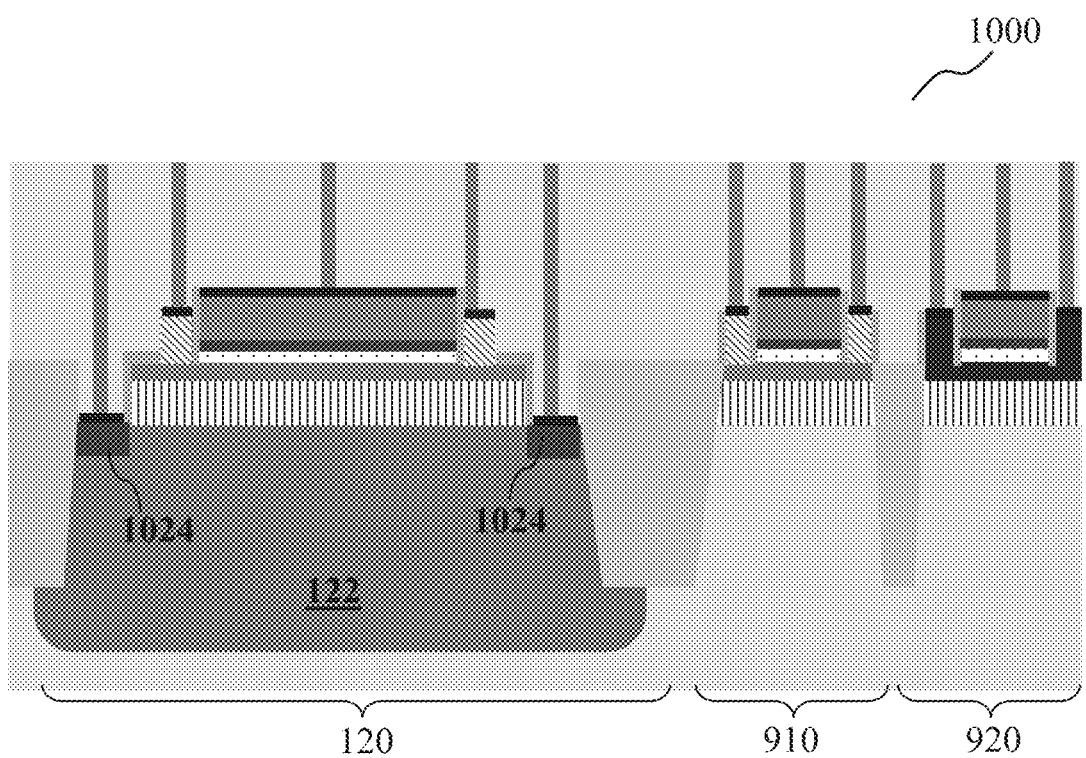
FIG. 10 shows a cross-sectional view of a semiconductor device according to various non-limiting embodiments.

According to various non-limiting embodiments, additional isolation elements 244 may be arranged at least partially around the periphery of the capacitive structure 120 of the semiconductor device 200 and at least partially in the first semiconductor layer 112, so as to isolate the capacitive structure 120 of the semiconductor device 200 from adjacent components, such as a further capacitive structure having a similar structure as the capacitive structure 120 show in FIG. 2 and arranged in the same substrate 110, and/or one or more MOSFETs arranged in the same substrate 110 as shown in the non-limiting embodiments of FIG. 10 and FIG. 11 below.

According to various non-limiting embodiments, the capacitive structure 120 may include a first capacitor C1 formed by at least the well region 122, the buried insulator layer 114 (e.g. at least a portion of the buried insulator layer 114 arranged over the well region 122), and the second semiconductor layer 116 (e.g., at least a portion of the second semiconductor layer 116 arranged over the well region 122). The buried insulator layer 114 may be in direct contact with the well region 122.

The capacitive structure 120 may further include a second capacitor C2 formed by at least the second semiconductor layer 116 (e.g. the portion of the second semiconductor layer 116 arranged over the well region 122), the gate dielectric layer 126, the metal gate layer 236, and the gate layer 128.

According to various non-limiting embodiments, a dual gate field effect transistor may be formed by at least the first capacitor C1, the second capacitor C2, the source region 132, and the drain region 134.

A primary gate may include at least the gate layer 128 configured to generate a channel between the source region 132 and the drain region 134 of the dual gate field effect transistor; and a secondary gate may include at least the well region 122 configured to generate a channel between the source region 132 and the drain region 134 of the dual gate field effect transistor.

The semiconductor device 200 may include one or more primary gate terminal contacts 250, source/drain terminal contacts 252, and secondary gate terminal contacts 254, which are configured to provide electrical connection to the respective primary/secondary gate and the source/drain regions through a plurality of interconnects 256, e.g., vias 256 arranged in a dielectric layer (not shown in FIGS. 2-4) arranged over the substrate 110 and the capacitive structure 120.

According to various non-limiting embodiments, the primary gate 128 may be electrically coupled to the secondary gate 122 through the primary gate terminal contact 250, the secondary gate terminal contact 254, the at least one contact 124, and the associated interconnects 256. The source region 132 may be electrically coupled to the drain region 134 through the source/drain terminal contacts 252 and the associated interconnects 256.

Figure 5:
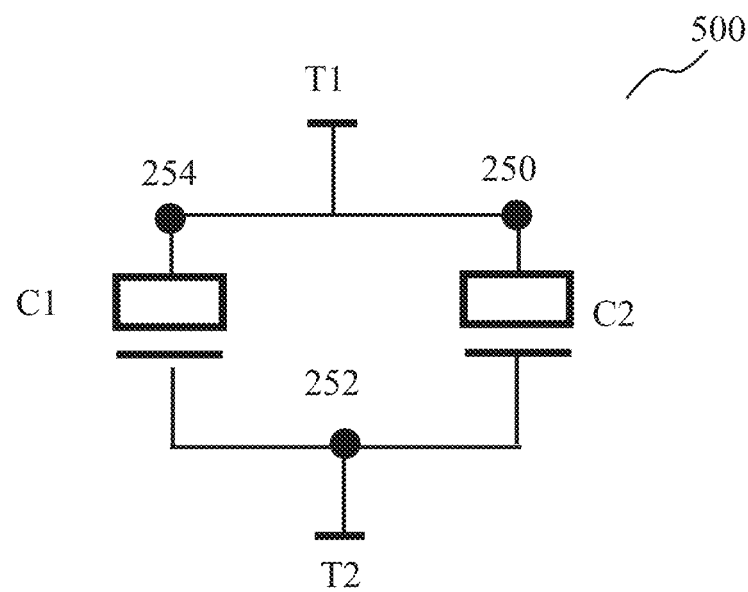
FIG. 5 shows an equivalent circuit of the semiconductor device of FIGS. 2-5 according to various non-limiting embodiments.

FIG. 5 shows an equivalent circuit 500 of the semiconductor device 200 of FIGS. 2-5 according to various non-limiting embodiments.

As shown in FIG. 5, the first capacitor C1 may be formed by at least the well region 122, at least a portion of the buried insulator layer 114 arranged over the well region 122, and at least a portion of the second semiconductor layer 116 arranged over the well region 122. A first capacitor terminal of the first capacitor C1 is provided with the secondary gate terminal contact 254, and a second capacitor terminal of the first capacitor C1 is provided with the source/drain terminal contacts 252.

The second capacitor C2 may be formed by at least the gate layer 128, the metal gate layer 236, the gate dielectric layer 126, and the portion of the second semiconductor layer 116 arranged over the well region 122. A first capacitor terminal of the second capacitor C2 is provided with the primary gate terminal contact 250, and a second capacitor terminal of the second capacitor C2 is provided with the source/drain terminal contacts 252.

In various non-limiting embodiments as shown in FIG. 5, the well region 122 and the gate layer 128 may be electrically coupled to a first terminal T1 by electrically connecting the primary gate terminal contact 250 to the secondary gate terminal contact 254. The source region 132 and the drain region 134 may be electrically coupled to a second terminal T2 by electrically connecting the source/drain terminal contacts 252. In this connection, the first capacitor C1 may be connected to the second capacitor C2 in parallel, such that the sum of the capacitances of the first capacitor C1 and the second capacitor C2 is provided by the capacitive structure of various non-limiting embodiments between the first terminal T1 and the second terminal T2.

In an illustrative example, the thickness of the gate dielectric layer 126 may be about 3.5 nm, and the thickness of the buried insulator layer 114 may be about 20 nm. The capacitance BCAP of the first capacitor C1 may be approximately determined according to:

$$BCAP \approx (d_{Gox}/d_{Box})*NCAP \approx 0.18*NCAP$$

wherein $d_{Gox}$ represents the thickness of the gate dielectric layer 126, $d_{Box}$ represents the thickness of the buried insulator layer 114, and NCAP represents the capacitance of the second capacitor C2.

Accordingly, the capacitive structure 120 of various non-limiting embodiments in the semiconductor device 200 provides a combined capacitance CAP=BCAP+NCAP=1.18*NCAP. Compared to the conventional MOS capacitor devices which only provides a capacitance NCAP, the capacitive structure of various non-limiting embodiments utilizes the substrate 100 to provide an additional capacitance of about 18% in the above example.

In a non-limiting embodiment where the first semiconductor layer 112 and the second semiconductor layer 116 both include silicon, the capacitive structure 120 of the semiconductor device 200 may be referred to as a stacked SISIP (Si-Insulator-Si-Insulator-Poly) MOS capacitor on SOI technology, which utilizes the bulk silicon, the buried insulator and the silicon layer on the buried insulator to provide an additional coupling capacitance.

Accordingly, the capacitive structure of various non-limiting embodiments provides a higher capacitance by utilizing the substrate 110 to provide an additional capacitor C1, without increasing the substrate area occupied by the capacitive structure. Hence, the semiconductor device 200 provides a higher density capacitance.

FIG. 6 shows a top view of a semiconductor device 600 according to various non-limiting embodiments. The semiconductor device 600 is similar to the semiconductor device 100, 200 of FIGS. 1-5, and thus the common features are labeled with the same reference numerals. Various embodiments described with reference to FIGS. 1-5 are analogously valid for the semiconductor device 600 of FIG. 6, and vice versa.

Similar to the semiconductor device 100, 200, the semiconductor device 600 may include the second semiconductor layer 116 and the gate layer 128, as part of the capacitive structure.

Different from the semiconductor device 100, 200, the second semiconductor layer 116 of the semiconductor device 600 may include a plurality of blocks (616a, 616b, . . . ) arranged parallel to each other along a first direction 602. The plurality of blocks may be spaced apart from each other. The gate layer 128 of the semiconductor device 600 may include a plurality of strips (628a, 628b, 628c, 628d, 628e, . . . ) arranged parallel to each other along a second direction 604 perpendicular to the first direction 602. The plurality of strips may be referred to as fingers, and may be spaced apart from each other. Accordingly, the capacitive structure of the semiconductor device 600 may be a peripheral (finger) type capacitive structure, with a multiple-finger in multiple-block configuration.

Although the non-limiting embodiments of FIG. 6 show the second semiconductor layer 116 having two blocks and the gate layer 128 having five strips, it is understood that any suitable number of blocks or strips may be included in the semiconductor device 600 according to various non-limiting embodiments.

FIG. 7 shows a flowchart 700 illustrating a method of forming a semiconductor device according to various non-limiting embodiments. The method may be used to form the semiconductor device 100, 200, 600 described in various non-limiting embodiments above. Various non-limiting embodiments described in context of the semiconductor device 100, 200, 600 are analogously valid for the respective method, and vice versa.

At 702, a substrate may be provided. The substrate may include a first semiconductor layer, a second semiconductor layer, and a buried insulator layer arranged between the first semiconductor layer and the second semiconductor layer.

At 704, a well region may be formed within the first semiconductor layer.

At 706, at least one contact to the well region may be formed.

At 708, a source region and a drain region may be formed over the second semiconductor layer.

At 710, a gate dielectric layer may be formed over the second semiconductor layer and laterally between the source region and the drain region.

At 712, a gate layer may be formed over the gate dielectric layer, thereby forming a capacitive structure at least partially within the substrate. The well region, the source region and the drain region may have the same conductivity type.

It is understood that the method may not be carried out in the sequence of 702-712 according to various embodiments. For example, the forming of the gate layer at 712 may be carried out before the forming of the source region and the drain region at 708 according to a non-limiting embodiment.

As described in various non-limiting embodiments above, the substrate may be provided as a semiconductor-on-insulator substrate, which may be prepared or formed such that the second semiconductor layer of the substrate may be a single-crystalline semiconductor layer. For example, the semiconductor-on-insulator substrate may be prepared or formed using SIMOX (separation by implantation of oxygen) method, wafer bonding, or seed methods. Examples of the semiconductor-on-insulator substrate may include but are not limited to a silicon-on-insulator (SOI) substrate, a germanium-on-insulator (GeOI) substrate, a SiGe-on-insulator (SiGe-OI) substrate, a InGaAs-on-insulator (InGaAs-OI) substrate, or combinations thereof. According to various non-limiting embodiments, the second semiconductor layer may include a single-crystalline semiconductor material. In a non-limiting example, the substrate may be a silicon-on-insulator substrate, wherein the second semiconductor layer may include single-crystalline silicon.

According to various non-limiting embodiments, the gate dielectric layer may be formed through a high-k insulator with metal gate process, or an oxidation furnace process.

According to various non-limiting embodiments, the source region and the drain region may be formed through an epi-grown process, or an implantation process.

The method may further include forming a metal gate layer arranged between the gate layer and the gate dielectric layer.

The method may further include forming a salicide layer over the gate layer, the at least one contact to the well region, the source region, and the drain region.

Various non-limiting embodiments of the method of forming the semiconductor device will be described in more detail below.

FIGS. 8A-8G illustrate a method of forming a semiconductor device according to various non-limiting embodiments. In the non-limiting embodiments of FIGS. 8A-8G, the method of forming the semiconductor device 200 is illustrated. It is understood that the method of FIGS. 8A-8G may be similarly used to form the semiconductor device 100, 600 of FIG. 1 and FIG. 6. Various non-limiting embodiments described in context of the semiconductor device above and the method of FIG. 7 are analogously valid for the method of FIGS. 8A-8G, and vice versa.

Figure 8A:
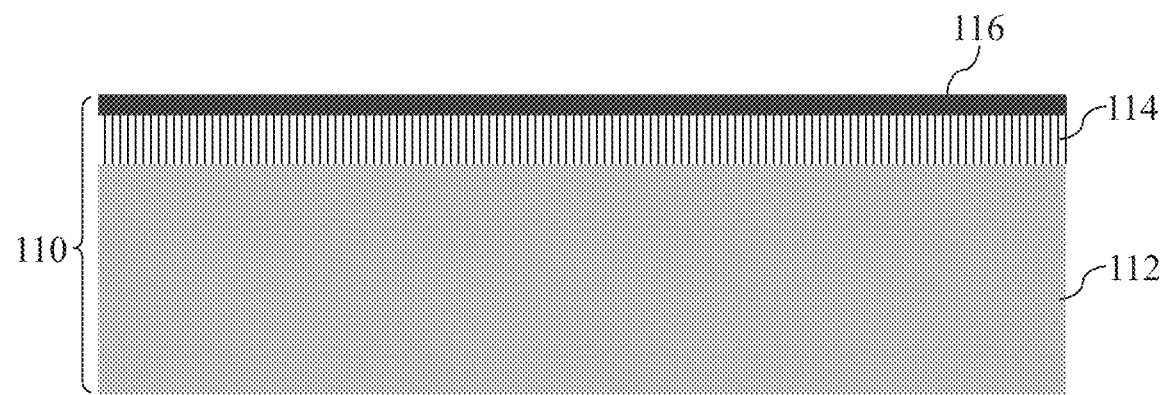
FIGS. 8A-8G illustrate a method of forming a semiconductor device according to various non-limiting embodiments.

As shown in FIG. 8A, the substrate 110 may be provided. The substrate 110 may include the first semiconductor layer 112, the second semiconductor layer 116, and the buried insulator layer 114 arranged between the first semiconductor layer 112 and the second semiconductor layer 116.

Figure 8B:
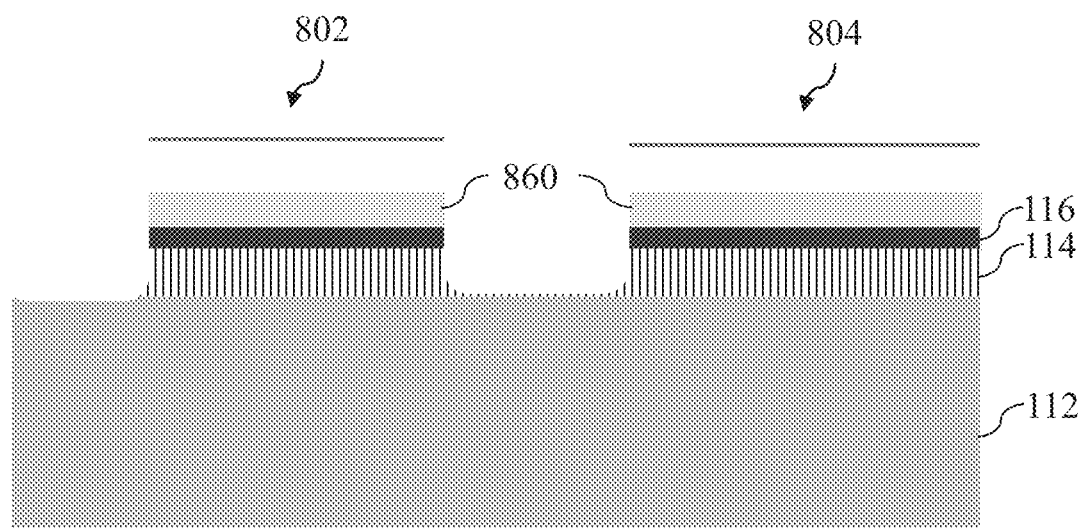

In FIG. 8B, active regions 802, 804 of the substrate 110, referred to as hybrid regions, may be formed or defined using a mask. The active regions 802, 804 may be the regions where one or more capacitive structures (e.g. MOSCAP) of various non-limiting embodiments may be formed or located, or where one or more transistors (e.g. MOSFETs) may be formed simultaneously with the capacitive structures. In various non-limiting embodiments, only one active region or more than two active regions may be formed. In the description of FIGS. 8C-8G below, only one active region 802 is illustrated.

A first dielectric layer 860, such as a pad oxide layer of $SiO_2$ or a pad nitride layer of SiN, may be formed over the second semiconductor layer 116 for protection.

Figure 8C:
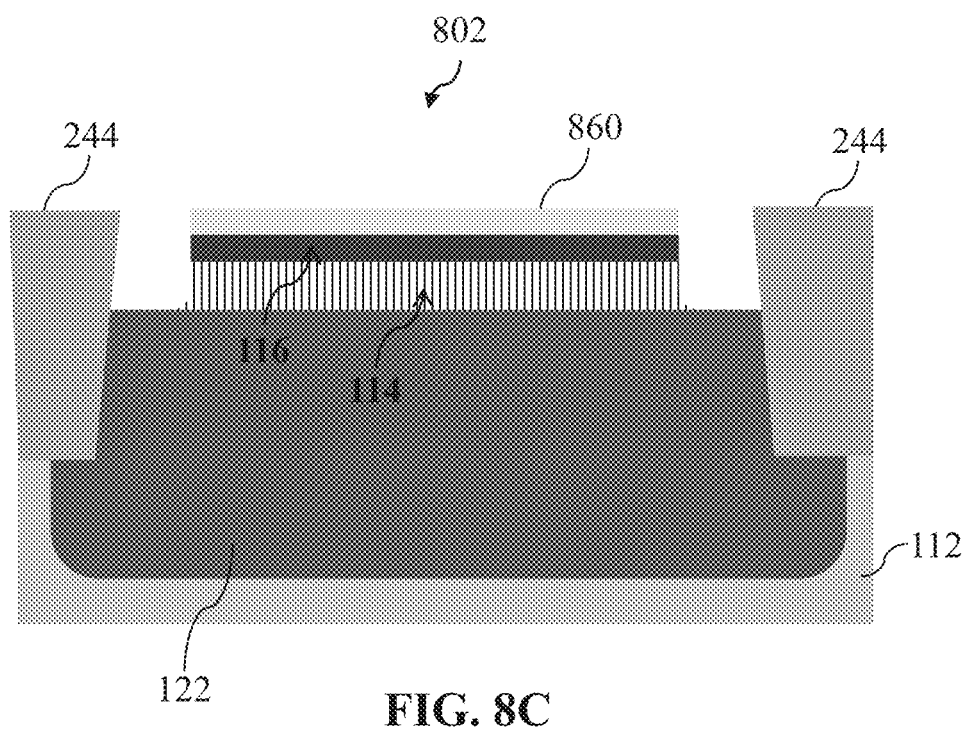

In FIG. 8C, the well region 122 may be formed, e.g. by ion implantation. The isolation elements 244 may also be formed for isolating the active region 802 from adjacent structures/devices. The isolation element 244 may be formed as STI.

Figure 8D:
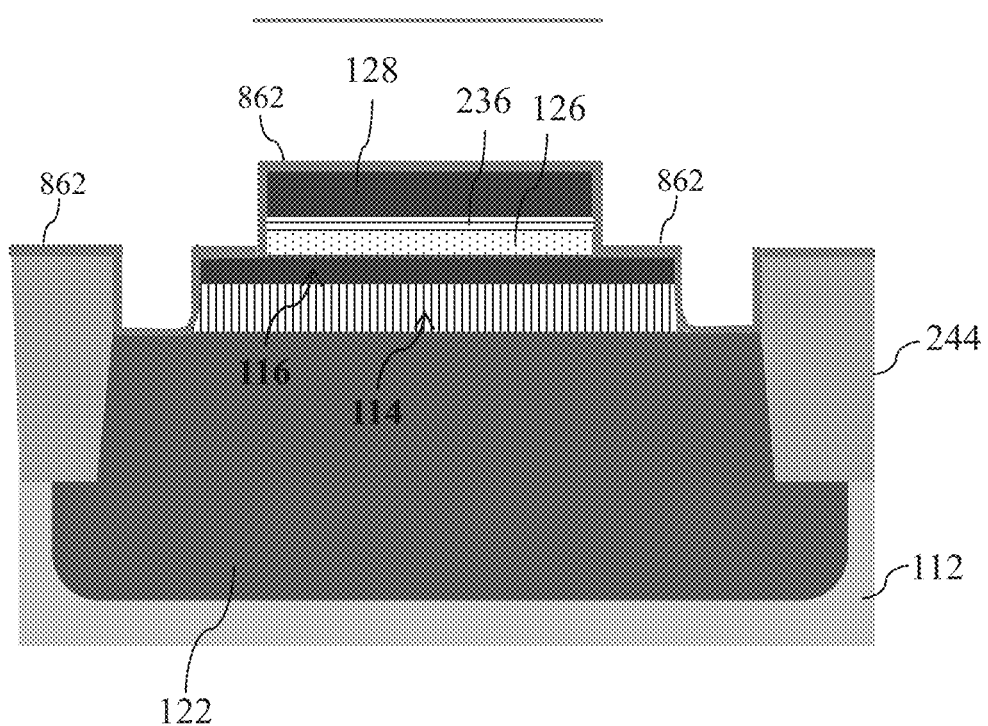

In FIG. 8D, the first dielectric layer 860 may be removed, and the gate dielectric layer 126 may be formed over the second semiconductor layer 116. The gate dielectric layer 126 may include a high-k insulating material, such as hafnium dioxide ($HfO_2$), zirconium dioxide ($ZrO_2$), titanium dioxide ($TiO_2$) or combinations thereof, which has "k" values higher than 3.9.

In various non-limiting embodiments, the metal gate layer 236 may be formed over the gate dielectric layer 126. The metal gate layer 236 may include TiN or Al. The gate layer 128, e.g., poly silicon gate layer, may be formed over the metal gate layer 236. The stack of the gate dielectric layer 126, the metal gate layer 236 and the gate layer 128 may be formed and aligned with a width smaller than the width of the underlying second semiconductor layer 116 through lithography process, so as to expose a portion of the second semiconductor layer 116 where the source and drain regions may be formed.

A second dielectric layer 862, e.g. the SiN spacer, may be formed over the exposed surfaces of respective layers/regions, which may include the gate layer 128, a portion of the second semiconductor layer 116 and the well region 122 as well as the isolation elements 244.

Figure 8E:
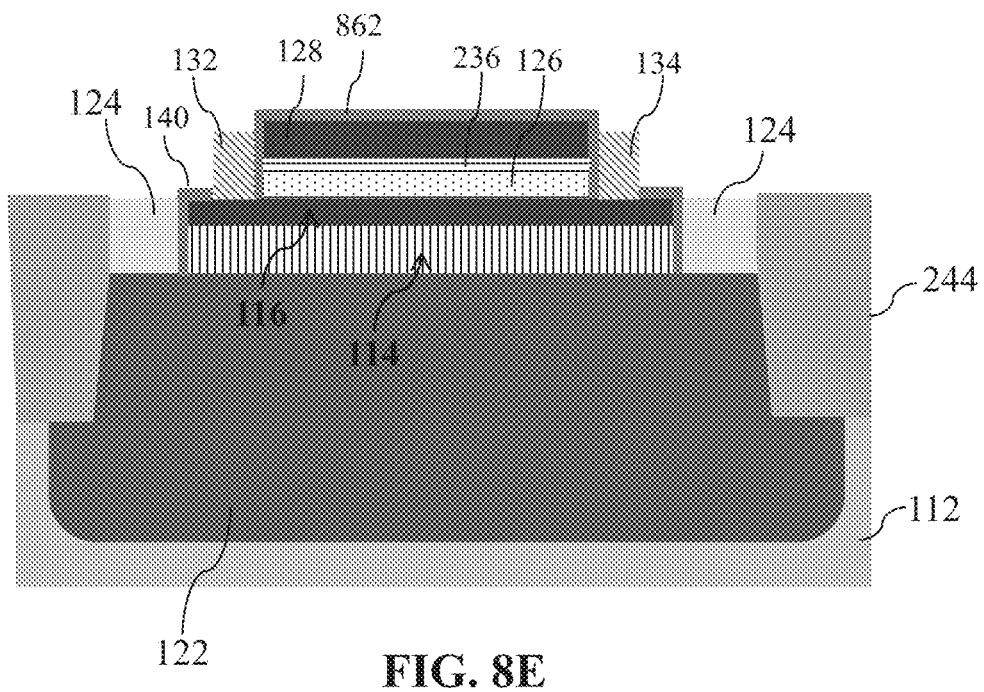

In FIG. 8E, the second dielectric layer 862 may be partially opened using a mask, for subsequent formation of the contact 124 and the source/drain regions 132, 134. At least one contact 124 may be formed over the well region 122, and the source region 132 and the drain region 134 may be formed over the second semiconductor layer 116, through an epi-grown process, or an implantation process. The second dielectric layer 862 may be remained between the contact 124 and the source/drain region 132, 134 to form the isolation element 140.

Figure 8F:
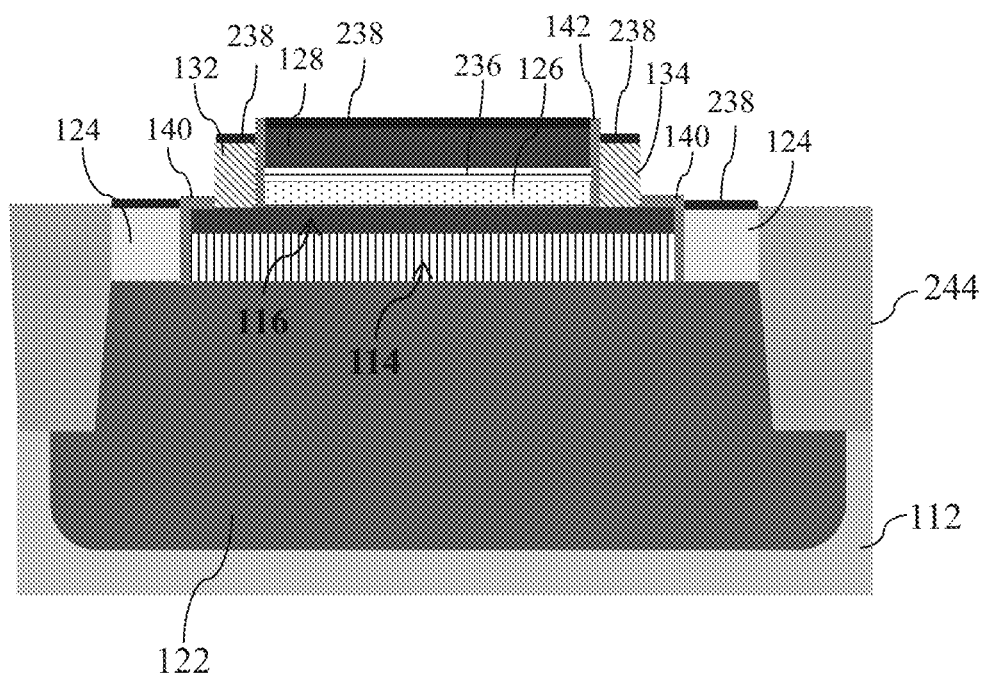

In FIG. 8F, the second dielectric layer 862 may be partially opened over the gate layer 128 for salicidation. The salicide layer 238 may be formed over the gate layer 128 by depositing nickel followed by annealing to form the NiSi layer 238. In various non-limiting embodiments, the salicide layer 238 may also be formed over the contact 124, the source region 132 and the drain region 134. The second dielectric layer 862 may be remained between the gate layer 128 and the source/drain region 132, 134 to form the further isolation element 142.

Figure 8G:
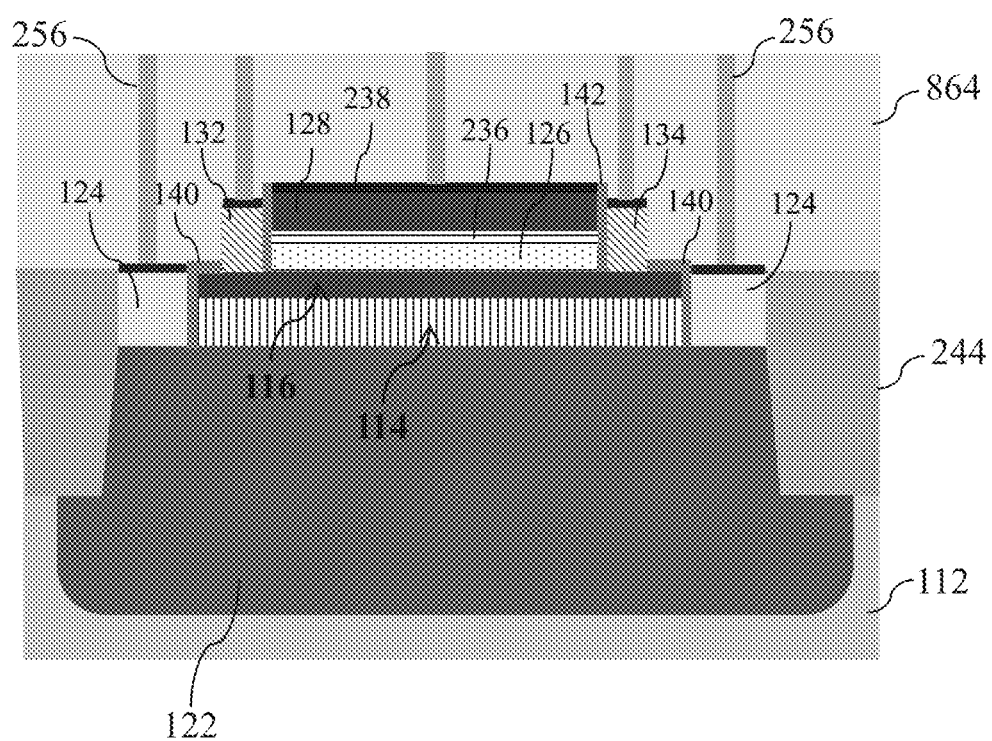

In FIG. 8G, an interlayer dielectric 864, e.g. a layer of SiO$_2$, may be formed over the entire structure of FIG. 8F. Trenches may be opened in the interlayer dielectric 864 and metal (e.g., tungsten) may be filled in the trenches to form the interconnects 256, for connection to the gate layer 128, the source/drain regions 132, 134, and the well region 122. Further terminal contacts may be formed over the interconnects 256 to form the semiconductor device 200 illustrated above.

FIGS. 9A-9I illustrate a method of forming a semiconductor device according to various non-limiting embodiments. In the non-limiting embodiments of FIGS. 9A-9I, the method of forming the semiconductor device 200 is illustrated. It is understood that the method of FIGS. 9A-9I may be similarly used to form the semiconductor device 100, 600 of FIG. 1 and FIG. 6. Various non-limiting embodiments described in context of the semiconductor device above and the methods of FIGS. 7 and 9A-9I are analogously valid for the method of FIGS. 9A-9I, and vice versa.

Figure 9A:
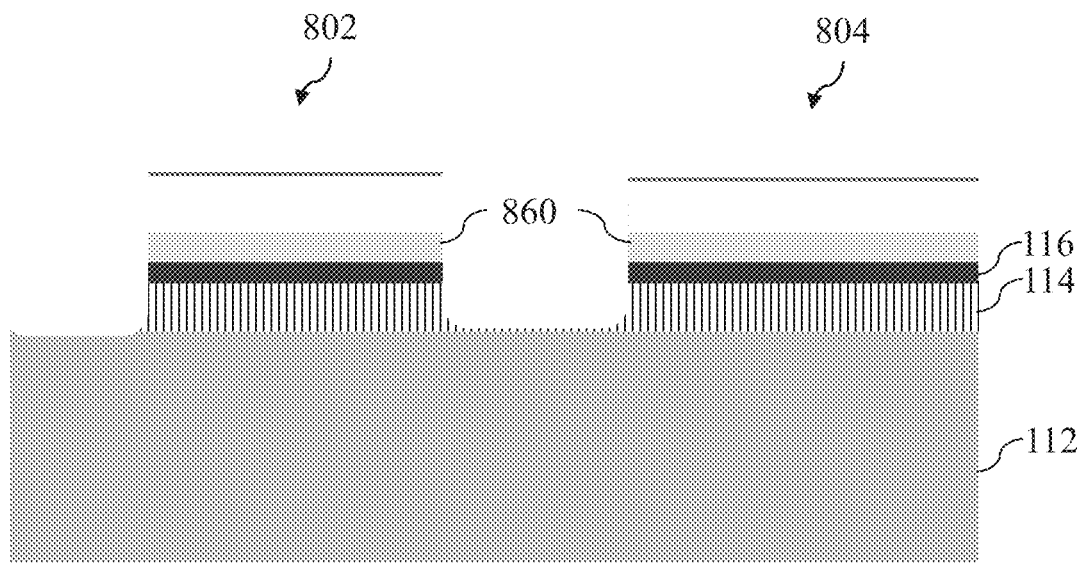
FIGS. 9A-9I illustrate a method of forming a semiconductor device according to various non-limiting embodiments.

In FIG. 9A, the method may be carried out using similar processes of FIGS. 8A-8B to form the structure obtained in FIG. 8B, where a first active region 802 and a second active region 804 are formed.

In various non-limiting embodiments as described with reference to FIGS. 9A-9I herein, a semiconductor device may be formed including the capacitive structure of various non-limiting embodiments above formed in the first active region 802, as well as MOSFETs formed in the second active region 804.

Figure 9B:
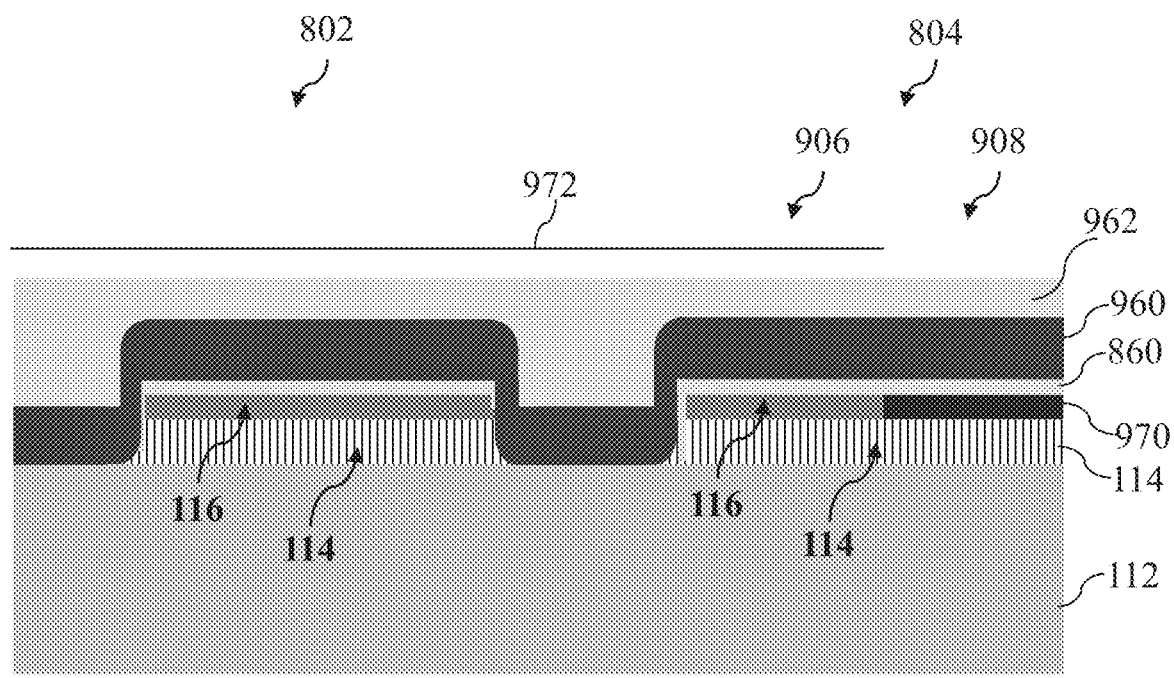

In FIG. 9B, a nitride hard mask 960 may be formed, for example, at least substantially conformally formed, over the structure formed in FIG. 9A. A third dielectric layer 962 may be formed over the nitride hard mask 960, and may be planarized. In the second active region 804, a first sub-region 906 and a second sub-region 908 may be defined, wherein the first sub-region 906 may be used to form a NMOS transistor and the second sub-region 908 may be used to form a PMOS transistor, or vice versa. The second semiconductor layer 116 (e.g., a silicon layer) in the second sub-region 908 may be selectively processed, e.g. using a mask 972, to form a layer of SiGe 970 in the second sub-region 908.

Figure 9C:
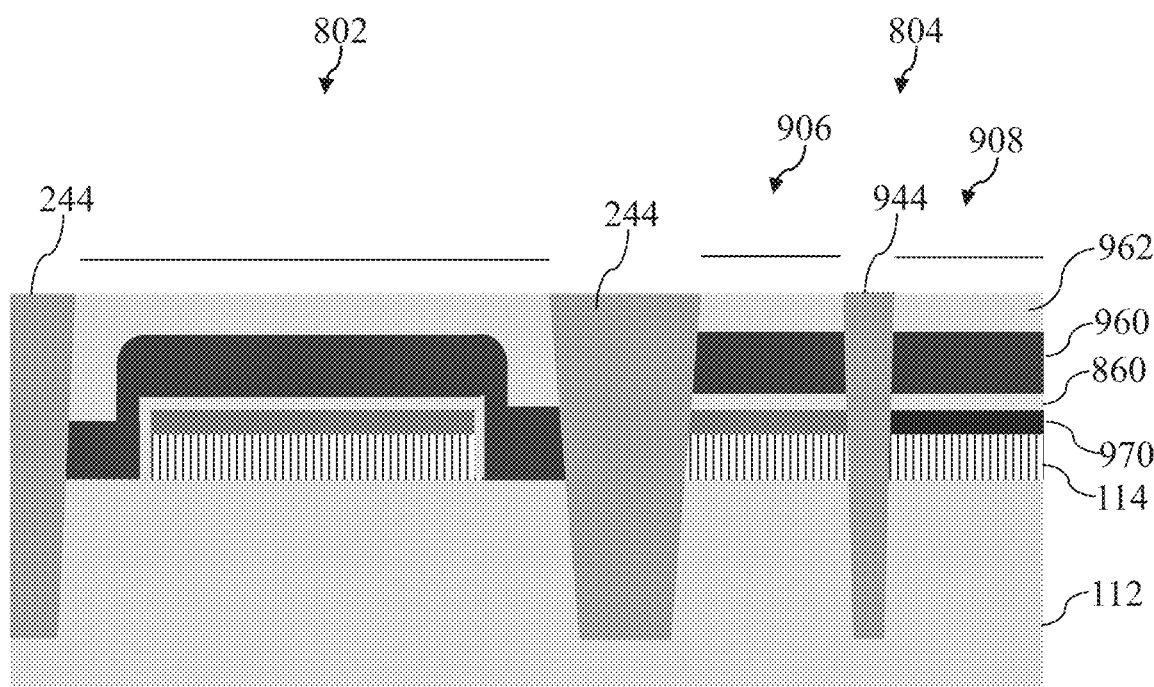

In FIG. 9C, the isolation elements 244, e.g., STI elements 244, may be formed at the peripheral of the first active region 802, to isolate the structure in the first active region 802 from the structure in the second active region 804. Further isolation elements 944 may also be formed between the first sub-region 906 and the second sub-region 908 to isolate them from each other.

Figure 9D:
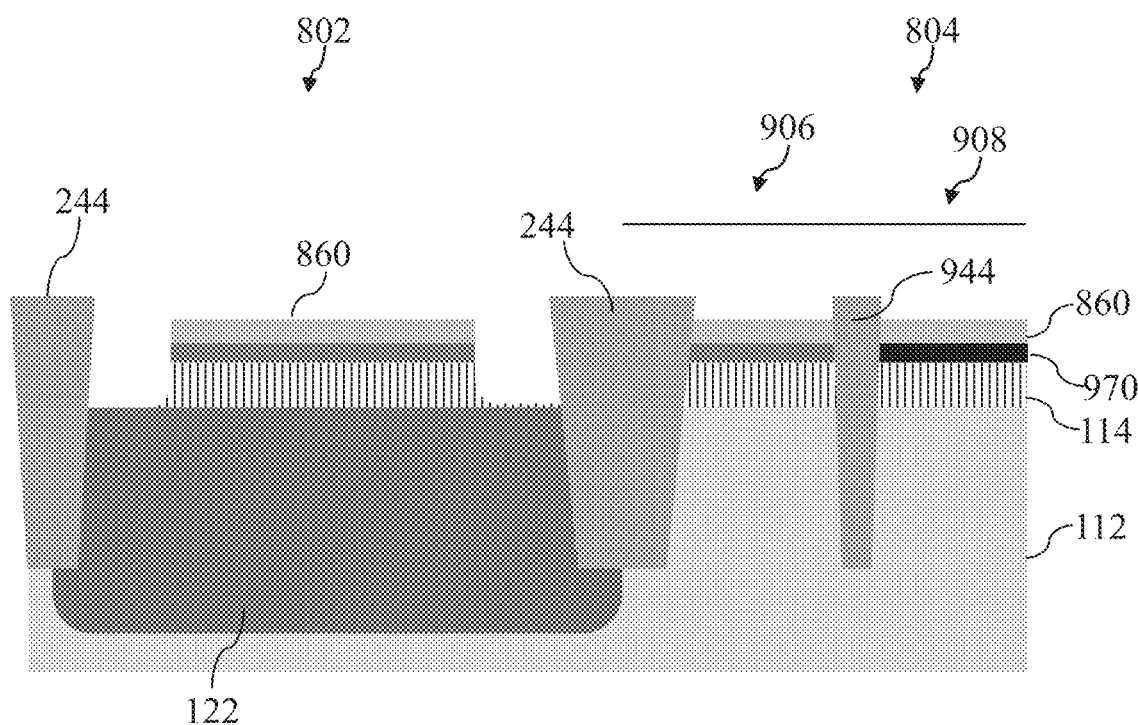

In FIG. 9D, the nitride hard mask 960 and the third dielectric layer 962 may be removed. The well region 122 may be formed, e.g. by ion implantation, within the first semiconductor layer 112 in the first active region 802.

Figure 9E:
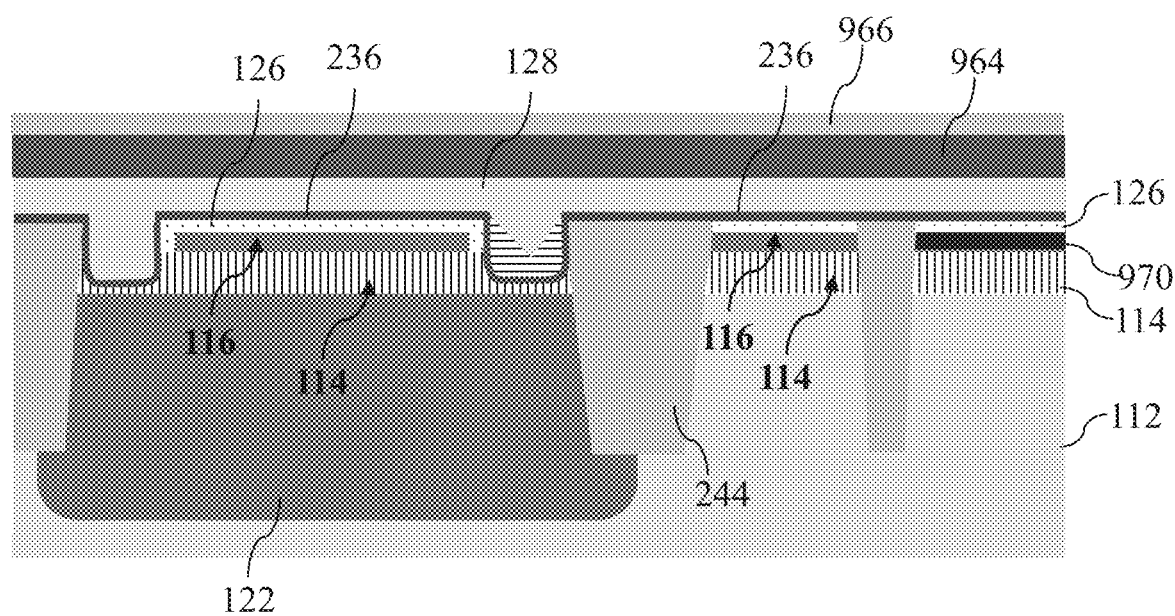

In FIG. 9E, the first dielectric layer 860 may be removed, and the gate dielectric layer 126 may be formed over the second semiconductor layer 116 and the SiGe layer 970. In various non-limiting embodiments, the gate dielectric layer 126 may include a high-k insulating material, such as hafnium dioxide, zirconium dioxide, titanium dioxide, or combinations thereof.

In various non-limiting embodiments, the metal gate layer 236, may be formed over the gate dielectric layer 126. The metal gate layer 236 may also be formed over the isolation elements 244, 944. The metal gate layer 236 may include TiN or Al.

The gate layer 128, e.g., polysilicon gate layer, may be formed over the metal gate layer 236. A nitride layer 964 may be formed over the gate layer 128, and an oxide layer 966 may be formed over the nitride layer 964.

Figure 9F:
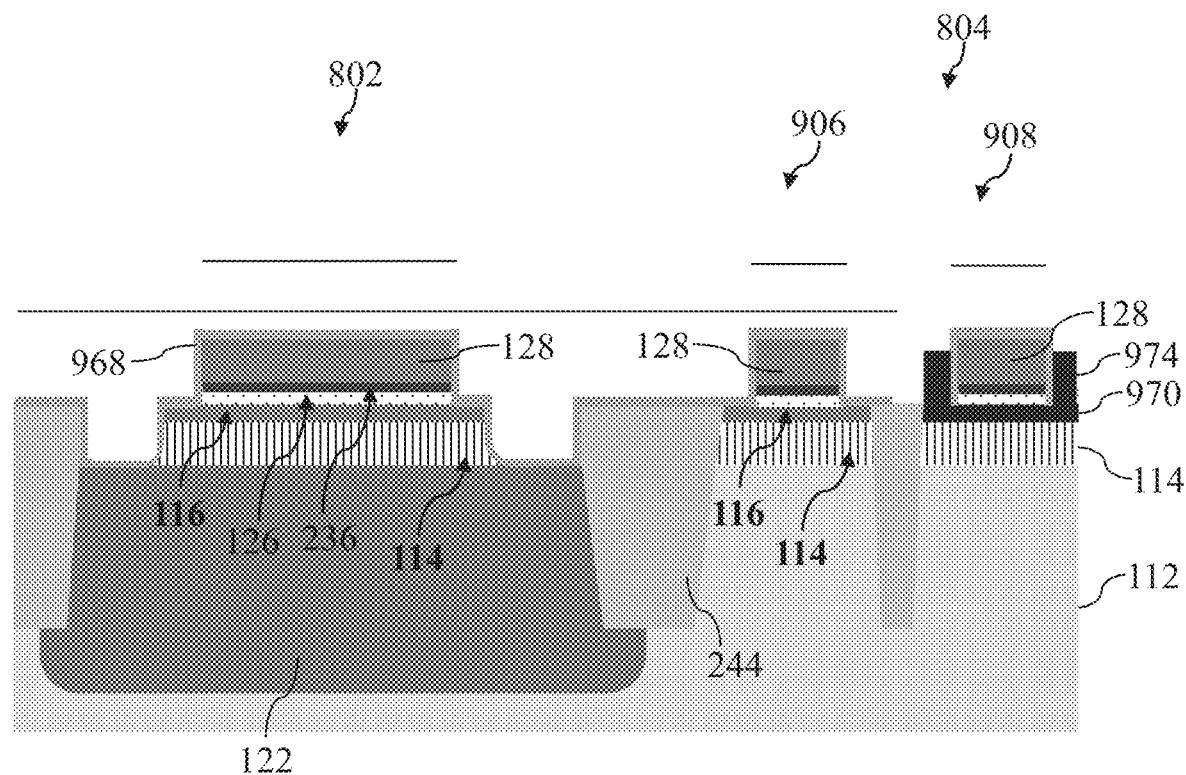

In FIG. 9F, the stack of the gate dielectric layer 126, the metal gate layer 236 and the gate layer 128 in the first active region 802 may be formed and aligned with a width smaller than the width of the underlying second semiconductor layer 116 through lithography process, so as to expose a portion of the second semiconductor layer 116 where the source and drain regions for the capacitive structure may be formed.

Similarly, the stack of the gate dielectric layer 126, the metal gate layer 236 and the gate layer 128 in the first sub-region 906 may be formed and aligned with a width smaller than the width of the underlying second semiconductor layer 116 through lithography process, so as to expose a portion of the second semiconductor layer 116 where the source and drain regions of the NMOS transistor may be formed. In the second sub-region 908, the stack of the gate dielectric layer 126, the metal gate layer 236 and the gate layer 128 may be formed and aligned with a width smaller than the width of the underlying SiGe layer 970 through lithography process, so as to expose a portion of the SiGe layer 970. SiGe regions 974 may be formed on the exposed portion of the SiGe layer 970 to form the source and drain regions of the PMOS transistor in the second sub-region 908.

A fourth dielectric layer 968, e.g. the SiN spacer, may be formed over the exposed surfaces of respective layers/regions, which may include the gate layer 128, a portion of the second semiconductor layer 116 and the well region 122 as well as the isolation elements 244.

Figure 9G:
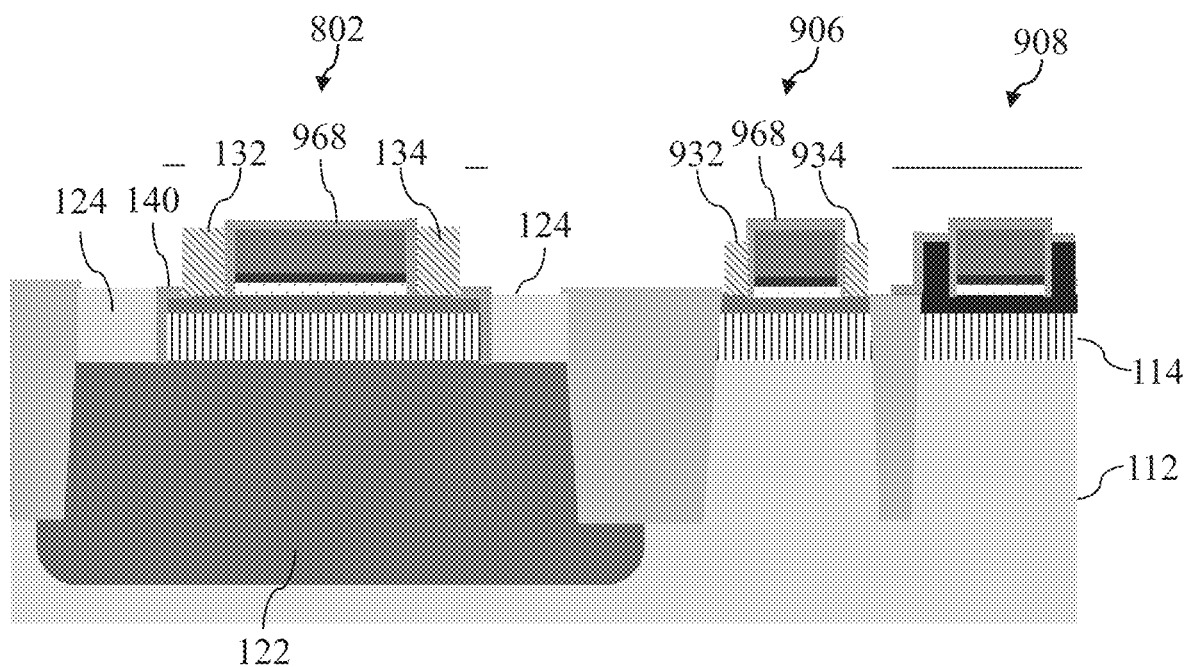

In FIG. 9G, the fourth dielectric layer 968 may be partially opened using a mask, for subsequent formation of the contact 124 and the source/drain regions 132, 134. At least one contact 124 may be formed over the well region 122, and the source region 132 and the drain region 134 may be formed over the second semiconductor layer 116 in the first active region 802, through an epi-grown process, or an implantation process. A source region 932 and a drain region 934 may also be formed over the second semiconductor layer 116 in the first sub-region 906. The fourth dielectric layer 968 may be remained between the contact 124 and the source/drain region 132, 134 to form the isolation element 140.

Figure 9H:
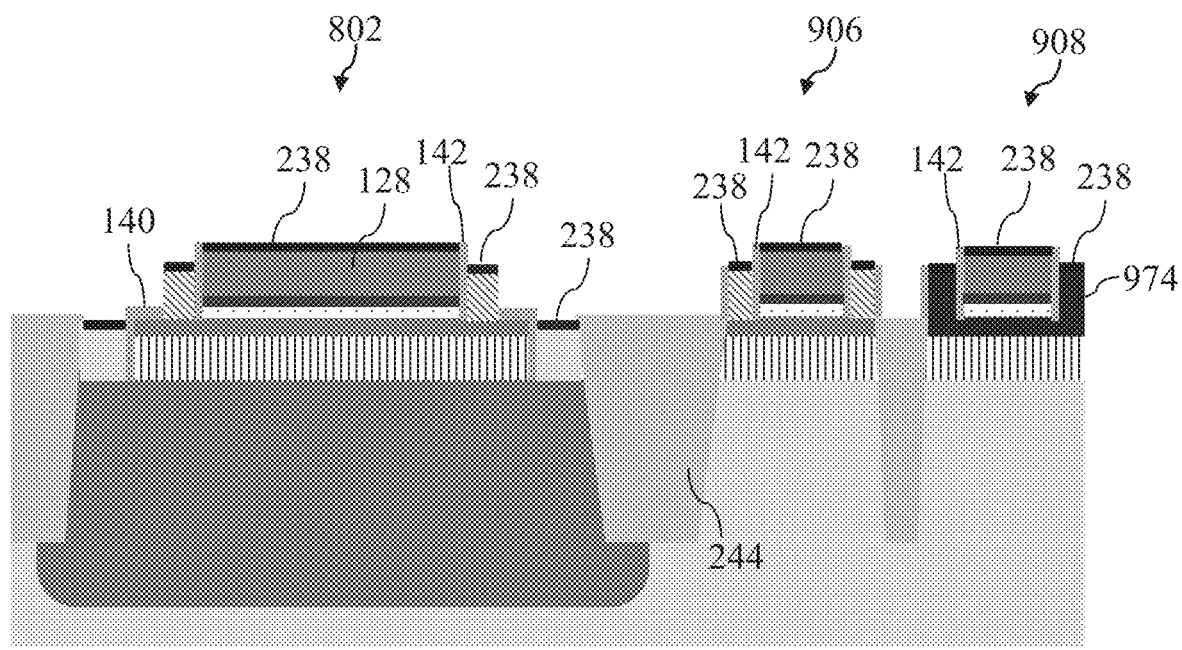

In FIG. 9H, the fourth dielectric layer 968 may be partially opened over the gate layer 128 for salicidation. The salicide layer 238 may be formed over the gate layer 128 in the first region 802, the first sub-region 906 and the second sub-region 908, by depositing nickel followed by annealing to form the NiSi layer 238. In various non-limiting embodiments, the salicide layer 238 may also be formed over the contact 124, the source region 132, 932 and the drain regions 134, 934, as well as the source and drain regions 974 of the PMOS transistor. The fourth dielectric layer 968 may be remained between the gate layer 128 and the source/drain region 132, 932, 134, 934, 974 to form the further isolation element 142.

Figure 9I:
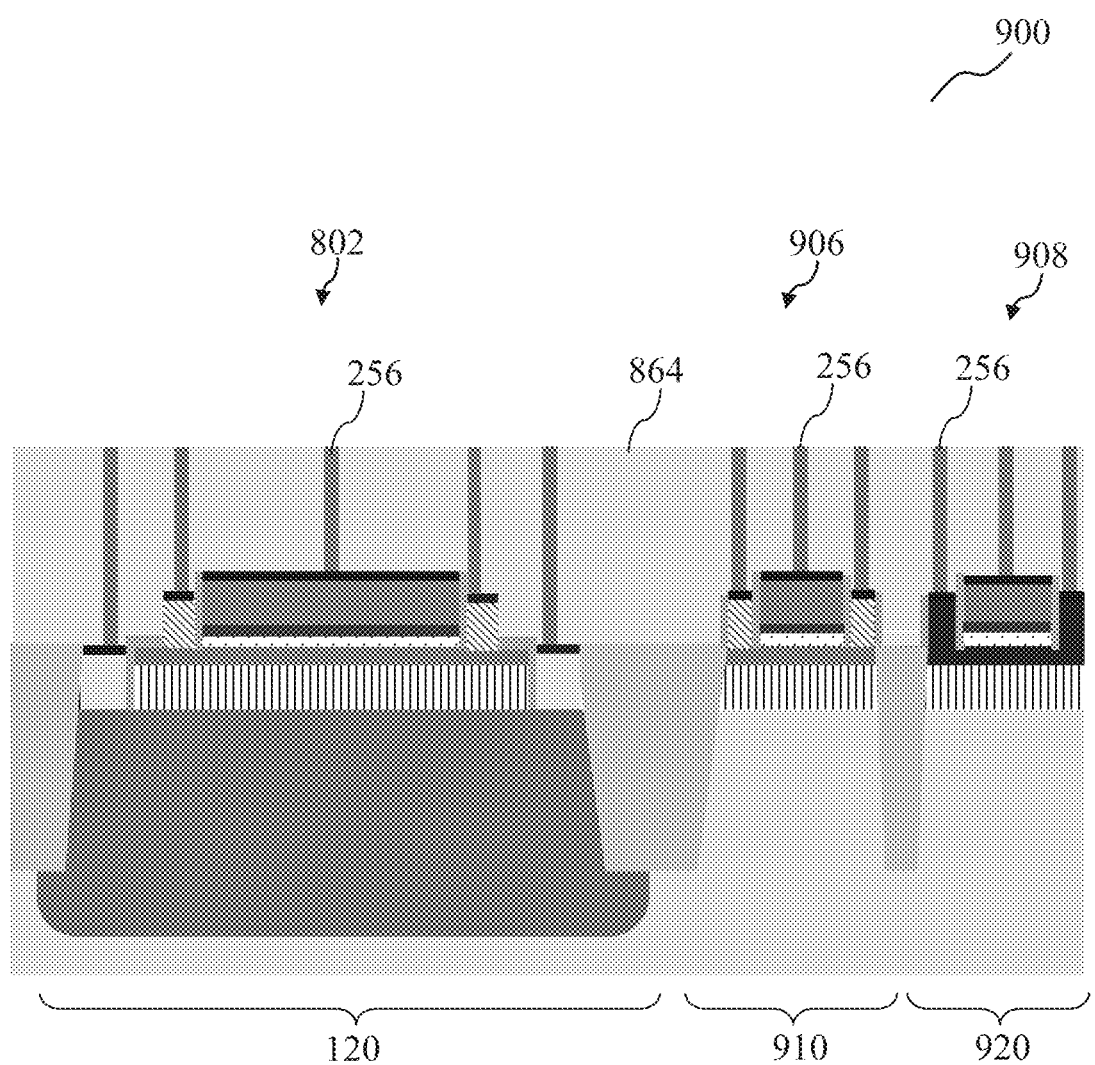

In FIG. 9I, the interlayer dielectric 864, e.g. a layer of $SiO_2$, may be formed over the entire structure of FIG. 9H. Trenches may be opened in the interlayer dielectric 864 and metal (e.g., tungsten) may be filled in the trenches to form the interconnects 256, for connection to the gate layer 128, the source/drain regions, and the well region 122 in the first active region 802, the first sub-region 906 and the second sub-region 908.

According to various non-limiting embodiments of FIGS. 9A-9I above, the semiconductor device 900 is formed, including the capacitive structure 120 of the semiconductor device 200 described above formed in the first active region 802, the NMOS transistor 910 formed in the first sub-region 906, and the PMOS transistor 920 formed in the second sub-region 908. It is understood that the semiconductor device 900 including any number of capacitive structures and transistors may be formed in the same processes as described in various non-limiting embodiments above.

FIG. 10 shows a cross-sectional view of a semiconductor device 1000 according to various non-limiting embodiments. The semiconductor device 1000 is similar to the semiconductor device 200 of FIG. 2 and the semiconductor device 900 of FIG. 9I. Various embodiments described with reference to FIG. 2 and FIGS. 9A-9I are analogously valid for the semiconductor device 1000 of FIG. 10, and vice versa.

As shown in FIG. 10, the semiconductor device 1000 is similar to the semiconductor device 900, except that the at least one contact 1024 to the well region 122 in the capacitive structure 120 is formed within the well region 122.

FIG. 11 shows a cross-sectional view of a semiconductor device 1100 according to various non-limiting embodiments. The semiconductor device 1100 is similar to the semiconductor device 200 of FIG. 2 and the semiconductor device 900 of FIG. 9I. Various embodiments described with reference to FIG. 2 and FIGS. 9A-9I are analogously valid for the semiconductor device 1100 of FIG. 11, and vice versa.

As shown in FIG. 11, the semiconductor device 1100 is similar to the semiconductor device 900, except that the isolation elements 1140 includes STI elements arranged at least partially within the substrate to isolate the contact 124 to the well region 122 from the source/drain regions 132, 134.

According to various non-limiting embodiments above, the semiconductor device 100, 200, 600, 900, 1000, 1100 provides a higher capacitance by utilizing the substrate 110 to provide an additional capacitor C1, without increasing the substrate area occupied by the capacitive structure. Hence, the semiconductor device of various non-limiting embodiments provides a higher density capacitance. The semiconductor device 100, 200, 600, 900, 1000, 1100 of various non-limiting embodiments is advantageous in increasing the total capacitance of the capacitive structure in Fully Depleted SOI process, and saving the silicon substrate area. Further, no additional process step or mask is required to form the capacitive structure of various non-limiting embodiments, compared to the process of forming the MOS transistors.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A semiconductor device comprising:
 a substrate comprising:
  a first semiconductor layer, comprising a well region arranged within the first semiconductor layer;
  a buried insulator layer arranged over the first semiconductor layer; and
  a second semiconductor layer arranged over the buried insulator layer; and
 a capacitive structure, wherein the capacitive structure comprises the well region, at least one contact to the well region, at least a portion of the buried insulator layer over the well region, at least a portion of the second semiconductor layer arranged over the buried insulator layer, a source region and a drain region arranged over the second semiconductor layer, a gate dielectric layer arranged over the second semiconductor layer and arranged laterally between the source region and the drain region, and a gate layer arranged over the gate dielectric layer;
 wherein the well region is in physical contact with the buried insulator layer, and wherein the well region, the source region, and the drain region have the same conductivity type.

2. The semiconductor device of claim 1, wherein the well region and the gate layer are conductively coupled to a first terminal of the capacitive structure; wherein the source region and the drain region are conductively coupled to a second terminal of the capacitive structure;
 wherein the capacitive structure is configured to provide a capacitance between the first terminal and the second terminal.

3. The semiconductor device of claim 1, further comprising an isolation element configured to isolate the at least one contact from the source region and the drain region.

4. The semiconductor device of claim 1, wherein the capacitive structure comprises a first capacitor formed by at least the well region, the buried insulator layer, and the second semiconductor layer, and wherein the capacitive structure further comprises a second capacitor formed by at least the second semiconductor layer, the gate dielectric layer, and the gate layer.

5. The semiconductor device of claim 4, wherein a dual gate field effect transistor is formed by at least the first capacitor, the second capacitor, the source region, and the drain region.

6. The semiconductor device of claim 5, wherein the well region and the gate layer are conductively coupled to a first terminal, and wherein the source region and the drain region are conductively coupled to a second terminal, wherein the dual gate field effect transistor is configured to provide a capacitance between the first terminal and the second terminal.

7. The semiconductor device of claim 5, wherein a primary gate comprises at least the gate layer configured to generate a channel between the source region and the drain region of the dual gate field effect transistor; wherein a secondary gate comprises at least the well region configured to generate a channel between the source region and the drain region of the dual gate field effect transistor.

8. The semiconductor device of claim 1, wherein a thickness of the buried insulator layer is larger than a thickness of the gate dielectric layer.

9. The semiconductor device of claim 1, further comprising a salicide layer arranged over the gate layer, the at least one contact, the source region, and the drain region.

10. The semiconductor device of claim 1, further comprising a metal gate layer arranged between the gate layer and the gate dielectric layer, wherein the gate layer comprises polycrystalline silicon.

11. The semiconductor device of claim 1, wherein the second semiconductor layer is un-doped or has the same conductivity type with the well region, the source region, and the drain region.

12. The semiconductor device of claim 1, wherein the first semiconductor layer comprises silicon, germanium, silicon-germanium, or combinations thereof, and wherein the second semiconductor layer comprises silicon, germanium, silicon-germanium, indium gallium arsenide, or combinations thereof.

13. The semiconductor device of claim 1, wherein the buried insulator layer comprises silicon oxide, silicon nitride, or combinations thereof, and wherein the substrate comprises a fully depleted silicon-on-insulator substrate, or a partially depleted silicon-on-insulator substrate.

14. The semiconductor device of claim 1, wherein the second semiconductor layer comprises a plurality of blocks arranged parallel to each other along a first direction, wherein the gate layer comprises a plurality of strips arranged parallel to each other along a second direction perpendicular to the first direction.

15. A method of forming a semiconductor device, the method comprising:

providing a substrate, wherein the substrate comprises a first semiconductor layer, a second semiconductor layer, and a buried insulator layer arranged between the first semiconductor layer and the second semiconductor layer;

forming a well region within the first semiconductor layer;

forming at least one contact to the well region;

forming a source region and a drain region over the second semiconductor layer;

forming a gate dielectric layer over the second semiconductor layer and laterally between the source region and the drain region; and forming a gate layer over the gate dielectric layer, thereby forming a capacitive structure at least partially within the substrate;

wherein the well region is in physical contact with the buried insulator layer, and wherein the well region, the source region and the drain region have the same conductivity type.

16. The method of claim 15, wherein the gate dielectric layer is formed through a high-k insulator with metal gate process, or an oxidation furnace process and wherein the source region and the drain region are formed through an epi-grown process, or an implantation process.

17. The semiconductor device of claim 1, wherein the source region and the drain region are separated from the buried insulator layer by the second semiconductor layer.

18. The semiconductor device of claim 1, wherein the source region and the drain region are arranged over and directly on the second semiconductor layer and wherein the gate layer and the gate dielectric layer have a width smaller than a width of the second semiconductor layer.

19. The semiconductor device of claim 18, further comprising isolation elements configured to isolate the gate layer from the source region and the drain region and wherein the well region, the buried insulating layer, the second semiconductor layer, the gate dielectric, and the gate layer are arranged in a stack.

20. The method of claim 15, wherein the source region and the drain region are formed over and directly on the second semiconductor layer and wherein the gate layer and gate dielectric layer are formed with a width smaller than a width of the second semiconductor layer.

* * * * *